(12) United States Patent
Kim et al.

(10) Patent No.: US 10,531,580 B2
(45) Date of Patent: Jan. 7, 2020

(54) ELECTRONIC DEVICE INCLUDING DISPLAY EQUIPPED WITH FORCE SENSOR

(71) Applicant: Samsung Electronics Co., Ltd., Gyeonggi-do (KR)

(72) Inventors: Jung Won Kim, Gyeonggi-do (KR); Eui Jin Kim, Gyeonggi-do (KR); Han Vit Kang, Gyeonggi-do (KR); Ho Kyung Kang, Daegu (KR); Byeong Cheol Kim, Gyeonggi-do (KR); Hyung Sup Byeon, Gyeonggi-do (KR); Jeong Sik Jeong, Gyeonggi-do (KR); Eun Sung Cho, Gyeonggi-do (KR); Kwang Tai Kim, Gyeonggi-do (KR); Hyun Ju Hong, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 4 days.

(21) Appl. No.: 15/668,925

(22) Filed: Aug. 4, 2017

(65) Prior Publication Data
US 2018/0042127 A1 Feb. 8, 2018

(30) Foreign Application Priority Data
Aug. 5, 2016 (KR) .................. 10-2016-0099886

(51) Int. Cl.
*G06F 3/041* (2006.01)
*H05K 5/00* (2006.01)
(Continued)

(52) U.S. Cl.
CPC ............. *H05K 5/0017* (2013.01); *G01L 1/14* (2013.01); *G01L 1/146* (2013.01); *G06F 1/1637* (2013.01);
(Continued)

(58) Field of Classification Search
CPC ............... G06F 3/0414; G06F 3/044; G06F 2203/04103; G06F 2203/04105
See application file for complete search history.

(56) References Cited

U.S. PATENT DOCUMENTS 8,698,769 B2   4/2014   Coulson et al.
8,749,519 B2   6/2014   Igeta
(Continued)

FOREIGN PATENT DOCUMENTS

KR   10-2015-0130994 A   11/2015
KR   10-2016-0076298 A   6/2016
(Continued)

OTHER PUBLICATIONS

International Search Report dated Nov. 20, 2017.
European Search Report dated Jul. 3, 2019.

*Primary Examiner* — Yuzhen Shen
(74) *Attorney, Agent, or Firm* — Cha & Reiter, LLC.

(57) ABSTRACT

An electronic device includes a housing that includes a first surface facing a first direction, a second surface facing a second direction that is opposite the first direction, and a transparent member forming at least part of the first surface, a display that is interposed between the first surface and the second surface of the housing and is exposed through the transparent member, and a force sensor that is interposed between the display and the second surface of the housing.

17 Claims, 28 Drawing Sheets

(51) Int. Cl.
*H05K 9/00* (2006.01)
*H03K 17/96* (2006.01)
*G01L 1/14* (2006.01)
*G06F 1/16* (2006.01)
*G06F 1/18* (2006.01)
*G06F 3/044* (2006.01)
*G02B 5/30* (2006.01)

(52) U.S. Cl.
CPC ............ *G06F 1/1652* (2013.01); *G06F 1/183* (2013.01); *G06F 3/044* (2013.01); *G06F 3/0412* (2013.01); *G06F 3/0414* (2013.01); *G06F 3/0416* (2013.01); *H03K 17/96* (2013.01); *H05K 9/0084* (2013.01); *G02B 5/30* (2013.01); *G06F 3/041* (2013.01); *G06F 2203/04103* (2013.01); *G06F 2203/04105* (2013.01)

(56) References Cited

U.S. PATENT DOCUMENTS

| | | | |
|---|---|---|---|
| 9,454,253 B2 | 9/2016 | Kim et al. | |
| 9,459,746 B2 | 10/2016 | Rosenberg et al. | |
| 9,535,529 B2 | 1/2017 | Kim et al. | |
| 9,547,388 B2 | 1/2017 | Kim et al. | |
| 9,575,586 B2 | 2/2017 | Kim et al. | |
| 9,578,148 B2 | 2/2017 | Kim et al. | |
| 9,619,068 B2 | 4/2017 | Kim et al. | |
| 9,652,097 B2 | 5/2017 | Kim et al. | |
| 9,658,712 B2 | 5/2017 | Kim et al. | |
| 9,746,964 B2 | 8/2017 | Rosenberg et al. | |
| 10,073,565 B2 | 9/2018 | Rosenberg et al. | |
| 2012/0218221 A1 | 8/2012 | Igeta | |
| 2013/0033450 A1 | 2/2013 | Coulson et al. | |
| 2013/0100072 A1 | 4/2013 | Liao et al. | |
| 2013/0285970 A1* | 10/2013 | Ahn | G06F 3/044 345/173 |
| 2014/0267152 A1 | 9/2014 | Curtis | |
| 2014/0327632 A1* | 11/2014 | Roudbari | G06F 3/0412 345/173 |
| 2015/0091859 A1 | 4/2015 | Rosenberg et al. | |
| 2015/0153887 A1 | 6/2015 | Kim et al. | |
| 2015/0153942 A1 | 6/2015 | Kim et al. | |
| 2015/0153951 A1 | 6/2015 | Kim et al. | |
| 2015/0212614 A1* | 7/2015 | Chen | G06F 3/044 345/174 |
| 2015/0268766 A1 | 9/2015 | Kim et al. | |
| 2015/0268780 A1 | 9/2015 | Kim et al. | |
| 2015/0268782 A1 | 9/2015 | Kim et al. | |
| 2015/0268783 A1 | 9/2015 | Yoon et al. | |
| 2015/0268802 A1 | 9/2015 | Kim et al. | |
| 2015/0268827 A1 | 9/2015 | Kim et al. | |
| 2015/0331517 A1* | 11/2015 | Filiz | G06F 3/0414 345/173 |
| 2016/0034087 A1 | 2/2016 | Kim et al. | |
| 2016/0035290 A1 | 2/2016 | Kim et al. | |
| 2016/0062500 A1 | 3/2016 | Kessler et al. | |
| 2016/0085336 A1 | 3/2016 | Kim et al. | |
| 2016/0088133 A1 | 3/2016 | Kim et al. | |
| 2016/0098131 A1* | 4/2016 | Ogata | G06F 1/1643 345/173 |
| 2016/0103543 A1* | 4/2016 | Kessler | G06F 3/0414 345/174 |
| 2016/0117024 A1 | 4/2016 | Kim et al. | |
| 2016/0124570 A1 | 5/2016 | Kim et al. | |
| 2016/0147341 A1 | 5/2016 | Kim et al. | |
| 2016/0162088 A1 | 6/2016 | Kim et al. | |
| 2016/0162089 A1 | 6/2016 | Kim et al. | |
| 2016/0162093 A1 | 6/2016 | Kim et al. | |
| 2016/0162094 A1 | 6/2016 | Kim et al. | |
| 2016/0188039 A1 | 6/2016 | Yoon et al. | |
| 2016/0196003 A1 | 7/2016 | Yoon et al. | |
| 2016/0216833 A1* | 7/2016 | Butler | G06F 3/0412 |
| 2016/0370909 A1* | 12/2016 | Wang | G06F 3/0416 |
| 2017/0031509 A1 | 2/2017 | Yoon et al. | |
| 2017/0060329 A1 | 3/2017 | Yoon et al. | |
| 2017/0075496 A1 | 3/2017 | Rosenberg et al. | |
| 2017/0090644 A1* | 3/2017 | Yao | G06F 3/0416 |
| 2017/0102809 A1* | 4/2017 | Son | G06F 3/0414 |
| 2017/0115786 A1* | 4/2017 | Kimura | G06F 3/0412 |
| 2017/0131834 A1 | 5/2017 | Kim et al. | |
| 2017/0220175 A1 | 8/2017 | Kim et al. | |
| 2017/0220244 A1 | 8/2017 | Kim et al. | |
| 2017/0322674 A1 | 11/2017 | Rosenberg et al. | |
| 2019/0018544 A1 | 1/2019 | Rosenberg et al. | |

FOREIGN PATENT DOCUMENTS

| | | |
|---|---|---|
| WO | 2016/033219 A1 | 3/2016 |
| WO | 2016/089186 A1 | 6/2016 |

* cited by examiner

ELECTRONIC DEVICE INCLUDING DISPLAY EQUIPPED WITH FORCE SENSOR

CLAIM OF PRIORITY

This application claims the benefit under 35 U.S.C. § 119(a) of a Korean patent application filed on Aug. 5, 2016 in the Korean Intellectual Property Office and assigned Serial number 10-2016-0099886, the entire disclosure of which is hereby incorporated by reference.

TECHNICAL FIELD

The present disclosure generally relates to an electronic device that includes a display equipped with a force sensor.

BACKGROUND

Electronic devices equipped with displays, such as smartphones, wearable devices, or the like have become commonplace as mobile communication technologies have advanced. These electronic devices may execute various functions such as photo or video capture, music or video playback, gaming, mobile communications, etc. The display is often employed for these functions.

In addition, these electronic devices may include various sensors to assist in the execution of the above-described functions. For example, the sensors may include a touch sensor, a force sensor, a fingerprint sensor, and/or the like. The touch sensor may sense whether an object (e.g., a finger of the user) makes contact with a transparent member of the electronic device, such as the glass surface of the display. The force sensor may sense the magnitude of pressure applied to the transparent member. The fingerprint sensor may recognize a fingerprint of the finger placed on the transparent member.

A potential disadvantage of these various sensors is that as more sensors are included in the electronic device, the size and/or thickness of the electronic device may increase. In particular, since the force sensor is often required to be disposed below the display and have multiple layers, the force sensor may significantly increase the thickness of the electronic device. Also, if the force sensor is disposed below the display and includes multiple layers, separation may occur between the layers.

Another potential disadvantage is that because the force sensor is a component that is independent of the display, dedicated integrated circuit and support layer may be required for the force sensor. The dedicated integrated circuit and support layer for the force sensor may also cause an increase in the manufacturing costs and power consumption of the electronic device.

SUMMARY

Aspects of the present disclosure are to address at least the above-mentioned problems and/or disadvantages and to provide at least the advantages described below. Accordingly, an aspect of the present disclosure is to provide an electronic device in which at least part of the force sensor is disposed in the display.

In accordance with an aspect of the present disclosure, an electronic device may include a housing including a first surface facing a first direction and a second surface facing a second direction that is opposite the first direction, wherein the housing includes a transparent member forming at least part of the first surface, a display interposed between the first surface and the second surface of the housing and exposed through the transparent member, and a force sensor interposed between the display and the second surface of the housing. The force sensor may include a first electrode layer disposed on a surface of the display, facing the second direction, and formed substantially in parallel with the display, a second electrode layer spaced apart from the first electrode layer in the second direction and formed substantially in parallel with the first electrode layer, and an opaque adhesive member interposed between the first electrode layer and the second electrode layer.

In accordance with another aspect of the present disclosure, an electronic device may include a display including a first surface facing a first direction and a second surface facing a second direction that is opposite to the first direction, a transparent member disposed over the first surface of the display, a force sensor disposed on the second surface of the display, and a printed circuit board disposed in the second direction below the force sensor. The force sensor may include a first electrode layer directly disposed on the second surface of the display, an opaque adhesive member disposed on a surface of the first electrode layer, facing the second direction, and a second electrode layer disposed on a surface of the opaque adhesive member, facing the second direction. The first electrode layer, the second electrode layer, and the display may be electrically connected to the printed circuit board.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
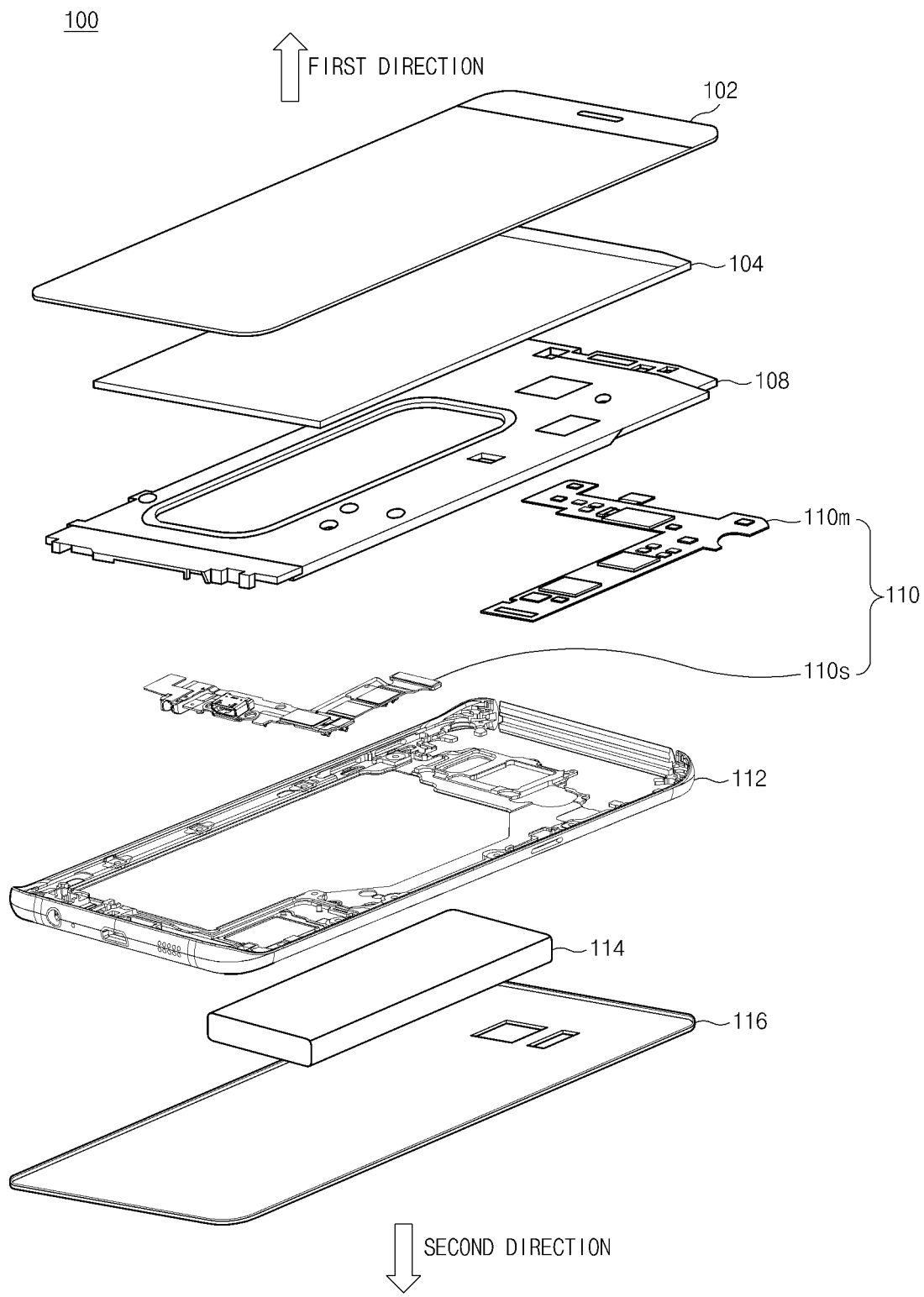
FIG. 1 is an exploded perspective view of an electronic device according to an embodiment.

Hereinafter, various embodiments of the present disclosure may be described with reference to accompanying drawings. Accordingly, those of ordinary skill in the art will recognize that modifications of, equivalents to, and/or alternatives to the various embodiments described herein can be variously made without departing from the scope and spirit of the present disclosure.

In this disclosure, the expressions "have," "may have," "include," "comprise," "may include," and "may comprise" are used herein to indicate existence of corresponding features (e.g., elements such as numeric values, functions, operations, or components) but do not exclude presence of additional features.

In this disclosure, the expressions "A or B," "at least one of A or/and B," or "one or more of A or/and B" and the like may include any and all combinations of one or more of the associated listed items. For example, the term "A or B," "at least one of A and B," or "at least one of A or B" may refer to cases (1) where at least one A is included, (2) where at least one B is included, and/or the case (3) where both of at least one A and at least one B are included.

Terms such as "first," "second," and the like may be used in this disclosure to refer to various elements regardless of the order and/or the priority and to distinguish certain elements from other elements, but do not limit the elements. For example, "a first user device" and "a second user device" indicate different user devices regardless of the order or priority. Without departing the scope of the present disclosure, a first element may be referred to as a second element, and similarly, a second element may be referred to as a first element.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element). In contrast, when an element (e.g., a first element) is referred to as being "directly coupled with/to" or "directly connected to" another element (e.g., a second element), it should be understood that there are no intervening elements (e.g., a third element).

According to the situation, the expression "configured to" used in this disclosure may be used as, for example, the expression "suitable for," "having the capacity to," "designed to," "adapted to," "made to," or "capable of" The term "configured to" must not mean only "specifically designed to" in hardware. Instead, the expression "a device configured to" may mean that the device is "capable of" operating together with another device or other components. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in this disclosure are used to describe specified embodiments and are not intended to limit the scope of another embodiment. The terms of a singular form may include plural forms unless otherwise specified. All the terms used herein, which include technical or scientific terms, may have the same meaning that is generally understood by a person skilled in the art. It will be further understood that terms, which are defined in dictionaries and commonly used, should also be interpreted according to their customary meanings in the relevant art and not in an non-customary manner unless expressly so defined in this disclosure. In some cases, even if certain terms are expressly defined in this disclosure, they may not be interpreted to exclude embodiments of this disclosure.

An electronic device according to various embodiments of this disclosure may be, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices. According to various embodiments, the wearable device may be an accessory (e.g., watches, rings, bracelets, anklets, necklaces, glasses, contact lens, or head-mounted-devices (HMDs), a fabric or garment-integrated device (e.g., an electronic apparel), a body-attached device (e.g., a skin pad or tattoos), or a bio-implantable device (e.g., an implantable circuit).

According to other embodiments, the electronic device may be a home appliance. The home appliances may be, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, and the like.

According to still other embodiments, an electronic device may be various medical devices (e.g., various portable medical measurement devices (e.g., a blood glucose monitoring device, a heartbeat measuring device, a blood pressure measuring device, a body temperature measuring device, and the like), a magnetic resonance angiography (MRA) scanner, a magnetic resonance imaging (MRI) scanner, a computed tomography (CT) scanner, other scanners, or an ultrasonic device), navigation devices, Global Navigation Satellite System (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller's machines (ATMs), points of sales (POSs) in stores, or internet of things (IoT) device (e.g., light bulbs, various sensors, electric or gas meters, sprinkler devices, fire alarms, thermostats, street lamps, toasters, exercise equipment, hot water tanks, heaters, boilers, and the like).

According to still other embodiment, the electronic device may be parts of furniture or buildings/structures, electronic boards, electronic signature receiving devices, projectors, or various measuring instruments (e.g., water meters, electricity meters, gas meters, or wave meters, and the like). According to various embodiments, the electronic device may be one of the above-described devices or a combination thereof. An electronic device according to an embodiment may be a flexible electronic device. Furthermore, an electronic device according to an embodiment of this disclosure may not be limited to the above-described electronic devices and may be, without departing from the spirit of the disclosure, include other electronic devices and new electronic devices developed in the art.

Hereinafter, electronic devices according to the various disclosed embodiments will be described with reference to the accompanying drawings. In this disclosure, the term "user" may refer to a person who uses an electronic device or may refer to a device (e.g., an artificial intelligence electronic device) that uses the electronic device.

FIG. 1 is an exploded perspective view of an electronic device according to an embodiment.

Referring to FIG. 1, an electronic device 100 according to an embodiment may include a transparent member 102, a display 104, a flexible printed circuit board (FPCB) (not shown), a bracket 108, a printed circuit board (PCB) 110, a rear housing 112, a battery 114, and a back cover 116. A force sensor may be interposed between the display 104 and the bracket 108, and the first electrode layer of the force sensor may be disposed directly under the display 104. According to various embodiments, the electronic device 100 may be implemented without some of the elements illustrated in FIG. 1 or may be implemented to further include additional elements not illustrated in FIG. 1.

The transparent member 102 according to an embodiment of the present disclosure may transmit light generated by the display 104 in the first direction shown in FIG. 1. Also, the user may place a portion (e.g., a finger) of his/her body on the transparent member 102 to generate a touch input. Alternatively, the user may place the tip of an electronic pen on the transparent member 102 to generate the touch input. The transparent member 102 may be made of, for example, tempered glass, reinforced plastic, a flexible polymer material, etc. and may protect the display 104 and elements in the electronic device 100 from external shocks.

For example, the transparent member 102 may be made with acrylonitrile butadiene styrene (ABS), acrylic, polycarbonate (PC), polymethyl methacrylate (PMMA), polyimide (PE), polyethylene terephthalate (PET), polypropylene terephthalate (PPT), amorphous polyethylene terephthalate (APET), polyethylene naphthalate terephthalate (PEN), polyethylene terephthalate glycol (PETG), tri-acetyl-cellulose (TAC), cyclic olefin polymer (COP), cyclic olefin copolymer (COC), polydicyclopentadiene (DCPD), cyclopentdienyl anions (CPD), polyarylate (PAR), polyethersulfone (PES), poly ether imide (PEI), modified epoxy resin, or acrylic resin, or a combination of two or more thereof. Alternatively, the transparent member 102 may include films with various hardness. In the case where the transparent member 102 includes a film having a particular hardness, there may be a hard coating for the film. In the present disclosure, the transparent member 102 may be also referred to as a "glass window".

The display 104 according to an embodiment of the present disclosure may be disposed below the transparent member 102 and may be disposed above the bracket 108. The display 104 may be electrically connected to the printed circuit board 110 such that the display 104 receives signals from the printed circuit board 110 and outputs content (e.g., text, images, videos, icons, widgets, symbols, or the like) according to the signals. The display 104 may further receive touch inputs (including actual touches, hovering inputs, and "force touches") from the user. A thin film (e.g., a sheet or a plate) made of copper (Cu) or graphite may be disposed on the rear surface of the display 104.

According to an embodiment, the display panel of the display 104 may be a liquid crystal display (LCD) panel, a light-emitting diode (LED) display panel, an organic LED (OLED) display panel, a microelectromechanical systems (MEMS) display panel, or an electronic paper display panel. The first electrode layer of the force sensor may be directly disposed under the display 104.

The FPCB according to an embodiment of the present disclosure may implement a wiring structure that electrically connects the printed circuit board 110 to the force sensor and the display 104. According to an embodiment, at least part of the wiring structure may be implemented by the FPCB.

At least part of the bracket 108 according to an embodiment of the present disclosure may be made of metal. For example, the bracket 108 may be made of magnesium alloy and may be disposed over the printed circuit board 110. The bracket 108 may be coupled with the display 104 and the printed circuit board 110 to physically support the display 104 and the printed circuit board 110. According to an embodiment, the bracket 108 may include a through-hole, through which part of the FPCB passes. Also, according to an embodiment, the bracket 108 may further include a swelling gap to accommodate the swelling of the battery 114 as the battery 114 ages. According to various embodiments, the through hole may be referred to as a via hole, an opening, an opening part, etc.

The printed circuit board 110 according to an embodiment of the present disclosure may include, for example, a first printed circuit board (e.g. a main printed circuit board 110m) and a second printed circuit board (e.g. a sub printed circuit board 110s). According to an embodiment, the main printed circuit board 110m and the sub printed circuit board 110s may be disposed below the bracket 108 and may be electrically connected to each other via a connector and wiring. The printed circuit boards 110m and 110s may be implemented with rigid printed circuit board (PCB)s, for example. According to an embodiment, various electronic components, elements, printed circuits, and the like of the electronic device 100 may be mounted or arranged on the printed circuit boards 110m and 110s. According to various embodiments, the printed circuit boards 110m and 110s may be referred to collectively as the "main board," a "printed board assembly (PBA)" or may be simply referred to as a "PCB."

The rear housing 112 according to an embodiment of the present disclosure may be disposed below the printed circuit board 110 and may accommodate the above-described elements of the electronic device 100. When back cover 116 is removed, the rear housing 112 may constitute the exterior of the electronic device 100. The rear housing 112 may be also referred to as a "rear case," a "rear plate," or the like.

The rear housing 112 according to an embodiment of the present disclosure may include an area that is not exposed and an area that is exposed to the exterior of the electronic device 100. For example, the area that is not exposed may be made of a plastic injection-molding material, and the area that is exposed to the exterior of the electronic device 100 may be made of metal. The exposed area may be also referred to as a "metal bezel." According to an embodiment, at least part of the metal bezel may be used as an antenna radiator for transmitting and receiving RF signals.

The battery 114 according to an embodiment of the present disclosure may convert chemical energy to electrical energy and vice versa. For example, the battery 114 may convert chemical energy into electrical energy and may supply the converted electrical energy to the display 104 and various elements or modules mounted on the printed circuit board 110. Alternatively, the battery 114 may convert electrical energy supplied from an external charger into chemical energy. According to an embodiment, a power management module for managing charging and discharging of the battery 114 may be included in the printed circuit board 110.

The back cover 116 according to an embodiment of the present disclosure may be coupled to the rear housing 112 of the electronic device 100 (i.e., below the rear housing 112). The back cover 116 may be made of tempered glass, a plastic injection-molding material, and/or metal. According to various embodiments, the back cover 116 may be integrated with the rear housing 112 or may be removable by the user.

Figure 2:
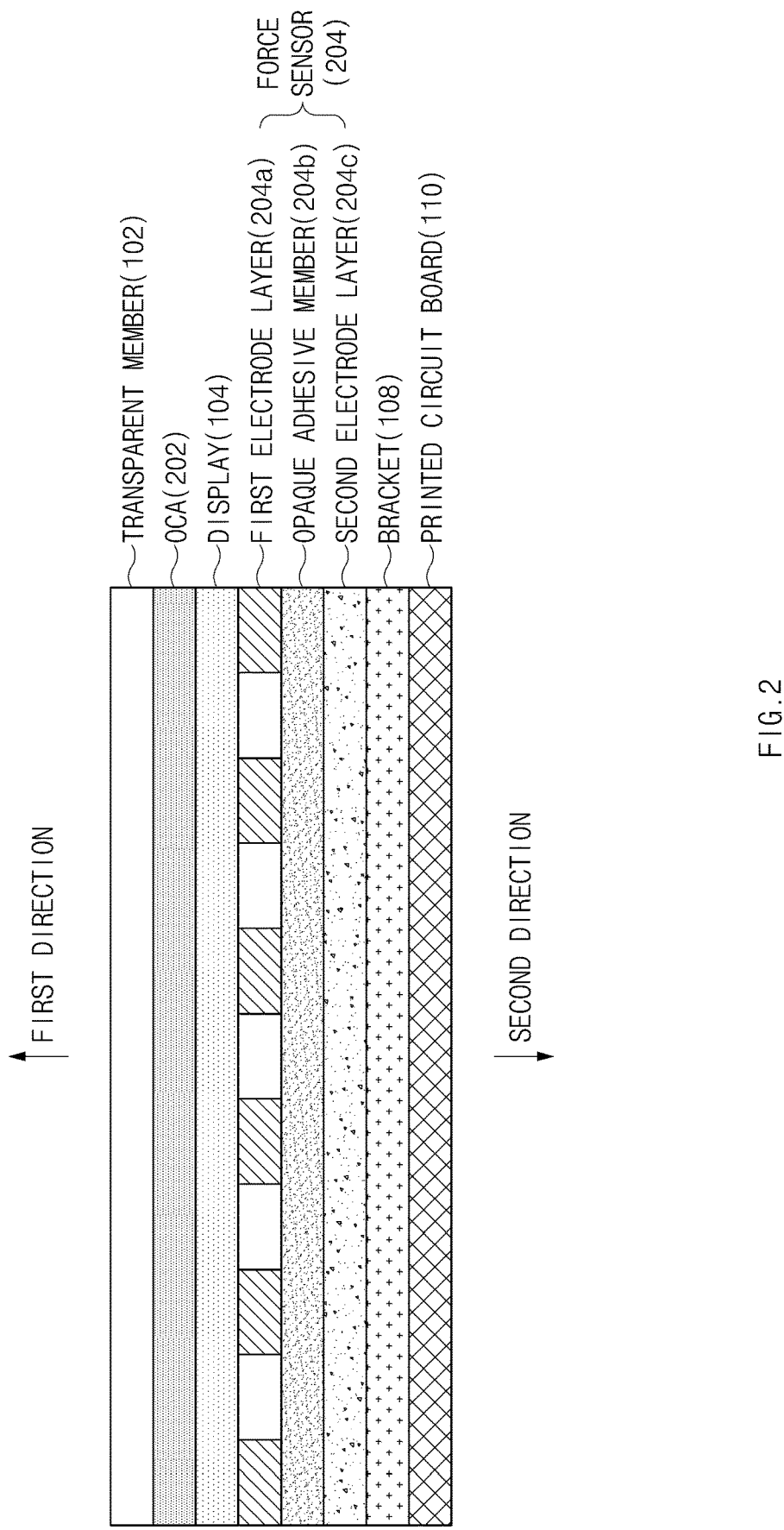
FIG. 2 is a sectional view of the electronic device in which a force sensor according to an embodiment is directly disposed in a display.

FIG. 2 is a sectional view of an electronic device in which a force sensor 204 according to an embodiment is directly disposed in the display 104. In this disclosure, the content described with reference to FIG. 1 may be identically applied to elements that have the same reference numerals in FIGS. 2-11.

Referring to FIG. 2, the electronic device 100 may include the transparent member 102, an optically clear adhesive (OCA) 202, the display 104, a force sensor 204, the bracket 108, and the printed circuit board 110.

The transparent member 102 according to an embodiment of the present disclosure may be glass or transparent plastic through which light emitted from the display 104 passes in the first direction. The OCA 202 may be an optically clear adhesive for adhering the transparent member 102 to the display 104. The OCA 202 may be transparent so that light emitted from the display 104 can pass through.

The display 104 according to an embodiment of the present disclosure may include a first surface facing the first direction and a second surface facing the second direction that is opposite to the first direction. The first direction may be the direction in which light from the display 104 is emitted, and the transparent member 102 may be disposed over the first surface facing the first direction. The force sensor 204 may be disposed on the second surface facing the second direction.

The force sensor 204 according to an embodiment of the present disclosure may include the first electrode layer 204a, an opaque adhesive member 204b, and a second electrode layer 204c. The force sensor 204 may detect the intensity of pressure applied to the transparent member 102 based on a change in capacitance between the first electrode layer 204a and the second electrode layer 204c. For example, the distance between the first electrode layer 204a and the second electrode layer 204c may decrease depending on the pressure applied to transparent member 102. Since the capacitance between the first electrode layer 204a and the second electrode layer 204c increases as the distance between the first electrode layer 204a and the second electrode layer 204c decreases, the force sensor 204 may detect the intensity of the pressure applied to the transparent member 102.

The first electrode layer 204a according to an embodiment of the present disclosure is directly disposed on the second surface of the display 104. For example, the first electrode layer 204a may be disposed on the second surface of the display 104 by deposition (e.g., chemical vapor deposition (CVD), plasma enhanced chemical vapor deposition (PECVD), or the like) or sputtering. If the first electrode layer 204a is disposed on the second surface of the display 104, the opaque adhesive member 204b may be disposed on the surface of the first electrode layer 204a facing the second direction. The second electrode layer 204c may then be disposed on the surface of the opaque adhesive member 204b facing the second direction. In other words, the first electrode layer 204a, the opaque adhesive member 204b, and the second electrode layer 204c may be arrange sequentially in the second direction, as shown in FIG. 2.

The force sensor 204 according to an embodiment of the present disclosure may include the first electrode layer 204a, the opaque adhesive member 204b, and the second electrode layer 204c that are sequentially disposed (e.g. deposited) on the second surface of the display 104. Alternatively, the first electrode layer 204a, the opaque adhesive member 204b, and the second electrode layer 204c may be pre-assembled. After the force sensor 204 is pre-assembled, the first electrode layer 204a may be disposed on the second surface of the display 104.

In an embodiment, each of the first electrode layer 204a and the second electrode layer 204c may include indium tin oxide (ITO), indium zinc oxide (IZO), PEDOT (poly ethylenedioxythiophene), Ag nanowire, metal mesh, graphene, and/or transparent polymer conductors. The first electrode layer 204a and the second electrode layer 204c may be conductors through which current flows. Implementation of the first electrode layer 204a and the second electrode layer 204c is not limited to the above-described example. The opaque adhesive member 204b may made of silver (Ag), copper (Cu), molybdenum (Mo), titanium (Ti), aluminum (Al), or graphene. However, particular implementations of the opaque adhesive member 204b is not limited to the above-described example.

According to an embodiment, in an alternative embodiment from FIG. 2, the second electrode layer 204c and the bracket 108 may be the same component. In other words, the second electrode layer 204c may be used to support the printed circuit board 110, and at the same time conduct a current so that the capacitance between the second electrode layer 204c and the first electrode layer 204a changes when pressure is applied to the transparent member 102. According to this embodiment, the thickness of the electronic device 100 may be decreases the second electrode layer 204c of the force sensor 204 is used as the bracket 108.

The bracket 108 according to an embodiment of the present disclosure may be disposed adjacent to the surface of the second electrode layer 204c facing the second direction. The bracket 108 may fix the printed circuit board 110 and may reduce interference between the display 104 and the printed circuit board 110.

The printed circuit board 110 according to an embodiment of the present disclosure may be disposed adjacent to the surface of the bracket 108 facing the second direction. The processor that controls the display 104, the force sensor 204, and the like may be mounted on the printed circuit board 110. For example, the processor may include an application processor and a driver IC. In an embodiment, the first electrode layer 204a, the second electrode layer 204c of the force sensor 204, and the display 104 may be electrically connected to the printed circuit board 110.

According to an embodiment of the present disclosure, the first electrode layer 204a and the second electrode layer 204c may be connected to a first processor (e.g., a force sensor IC) that is mounted on the printed circuit board 110. The display 104 may be connected to a second processor (e.g., a display driver IC) mounted on printed circuit board 110 or on another printed circuit board not shown in FIG. 2. The first processor and the second processor may control the force sensor 204 and the display 104, respectively.

According to an embodiment of the present disclosure, the first electrode layer 204a, the second electrode layer 204c, and the display 104 may be connected to one processor mounted on the printed circuit board 110. In this case, the processor may control both the force sensor 204 and the display 104 concurrently. In some circumstances, when the force sensor 204 and the display 104 are controlled by the same processor, power consumption may decrease compared to when the force sensor 204 and the display 104 are controlled by two separate processors. However, in other circumstances, controlling the force sensor 204 and the display 104 with two separate processors may reduce power consumption as compared to controlling the force sensor 204 and the display 104 with a single processor. For example when the force sensor 204 is off while the display is on, the force sensor IC may be deactivated to reduce power consumption.

In an embodiment, the electronic device 100 may include a housing. The housing may include a first surface facing the first direction and a second surface facing the second direction. The transparent member 102 may form at least part of the first surface. The housing may be implemented by coupling the transparent member 102 to the rear housing 112 and the back cover 116. The display 104 may be interposed between the first surface and the second surface of the housing and may be exposed through the transparent member 102.

The force sensor 204 according to an embodiment of the present disclosure may be interposed between the display 104 and the second surface of the housing and may include the first electrode layer 204a, the opaque adhesive member 204b, and the second electrode layer 204c. The first electrode layer 204a may be disposed on the surface of the display 104 that faces the second direction and may be substantially in parallel with the display 104. The second electrode layer 204c may be spaced apart from the first electrode layer 204a in the second direction and may be substantially in parallel with the first electrode layer 204a. The opaque adhesive member 204b may be interposed between the first electrode layer 204a and the second electrode layer 204c.

Figure 3A:
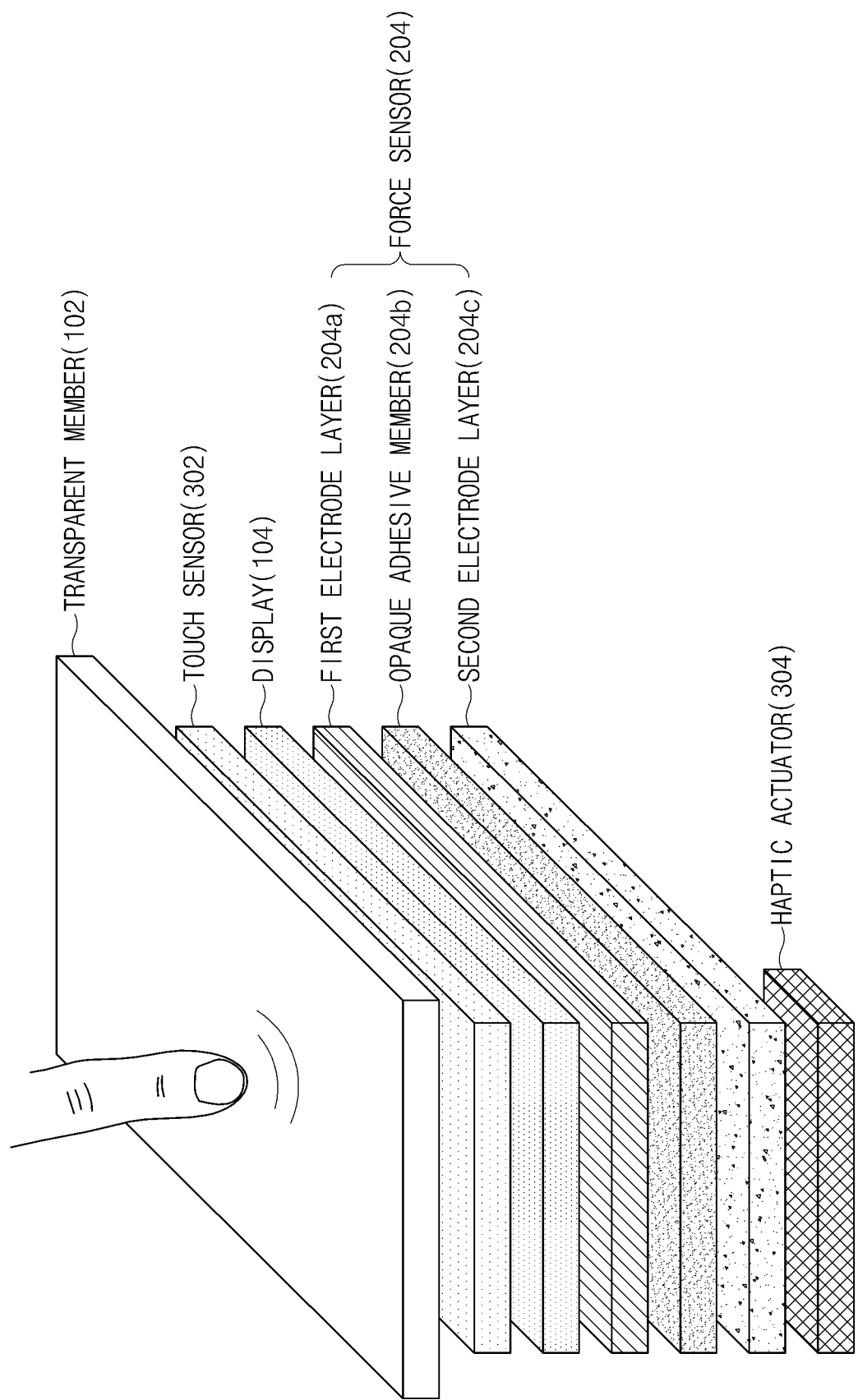
FIG. 3A is an exploded perspective view illustrating the stacked structure of a haptic actuator, a force sensor, a display, and a touch sensor, according to an embodiment.
Figure 3B:
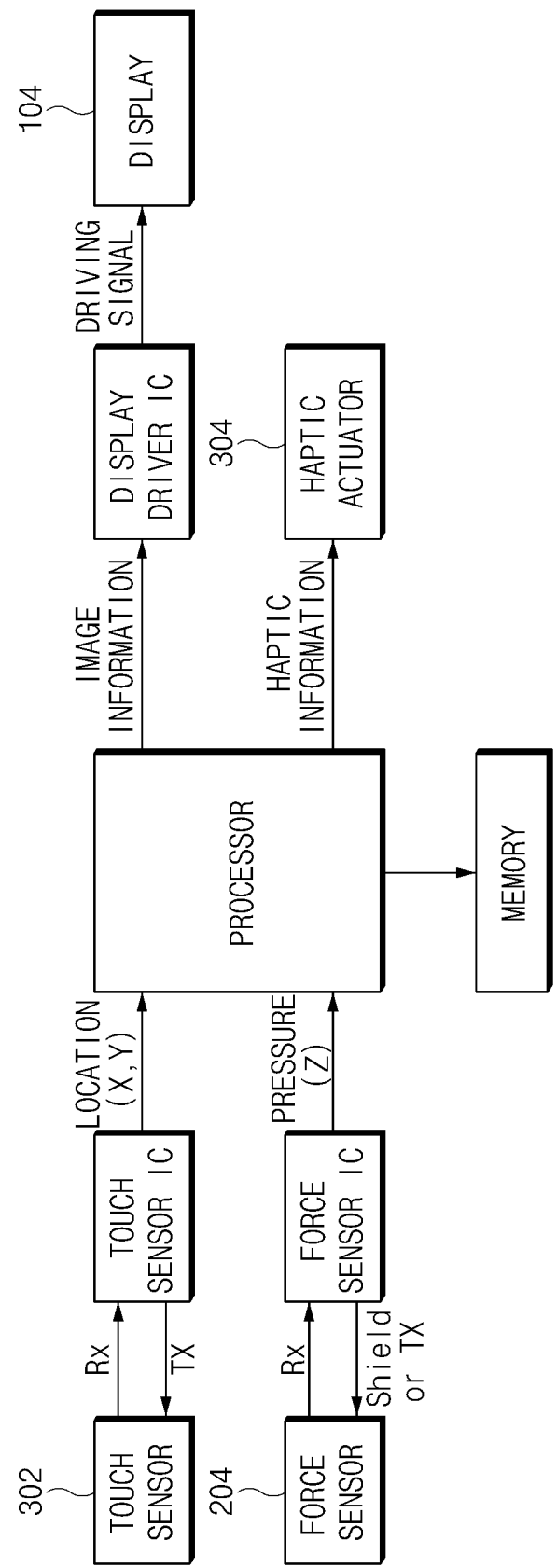
FIG. 3B is a block diagram of certain components of an electronic device according to an embodiment.

FIG. 3A is an exploded perspective view illustrating the stacked structure of a haptic actuator, a force sensor, a display, and a touch sensor, according to an embodiment. FIG. 3B is a block diagram of certain components of an electronic device according to an embodiment.

Referring to FIG. 3A, the electronic device 100 may further include a touch sensor 302 and a haptic actuator 304. The touch sensor 302 may sense locations of touch inputs (e.g., actual touches, touch gestures, hovering inputs, force touch inputs, or the like) of an object (e.g., the user's finger) on the transparent member 102. "Force touch" may refer to touch inputs where the pressure of the touch is also measured in addition to the location of the touch. The touch sensor 302 is illustrated in FIG. 3A as being interposed between the transparent member 102 and the display 104. However, the disclosed invention is not so limited. For example, the touch sensor 302 may be disposed within the display 104.

The haptic actuator 304 according to an embodiment of the present disclosure may provide vibrational feedback. For example, if the user touches the transparent member 102, the haptic actuator 304 may output vibrations as feedback for the touch. As another example, if the pressure of a user touch on the transparent member 102 exceeds a predetermined threshold, the haptic actuator 304 may output vibrations as feedback for the touch. In yet another example, when the user applies pressure of a first intensity, the haptic actuator 304 may provide vibration of a first degree (e.g., intensity or time duration); when the user applies pressure of a second intensity, the haptic actuator 304 may provide vibration of a second degree. Thus, the haptic actuator 304 may provide haptic feedback to the user by generating vibrations.

Referring to FIG. 3B, a processor may be electrically connected to the display 104, the force sensor 204, the touch sensor 302, the haptic actuator 304, and a memory. The processor may receive signals from the force sensor 204 and the touch sensor 302 and may control the display 104 or the haptic actuator 304 based on the signals. The memory may store instructions for controlling the display 104, the haptic actuator 304, etc. The processor may control the display 104, the haptic actuator 304, etc. based on the instructions stored in the memory.

In an embodiment, if the user touches the transparent member 102, the touch sensor 302 may transmit the location of the touched area to the processor through the touch sensor IC. In response to receiving the touch location, the processor may turn on or off the display 104 or may cause the haptic actuator 304 to vibrate. In another embodiment, if the user exerts a pressure on the transparent member 102, the force sensor 204 may transmit the magnitude of pressure applied to the transparent member 102 to the processor through the force sensor IC. In response to receiving the pressure data, the processor may turn on or off the display 104 or may cause the haptic actuator 304 to vibrate.

Figure 4A:
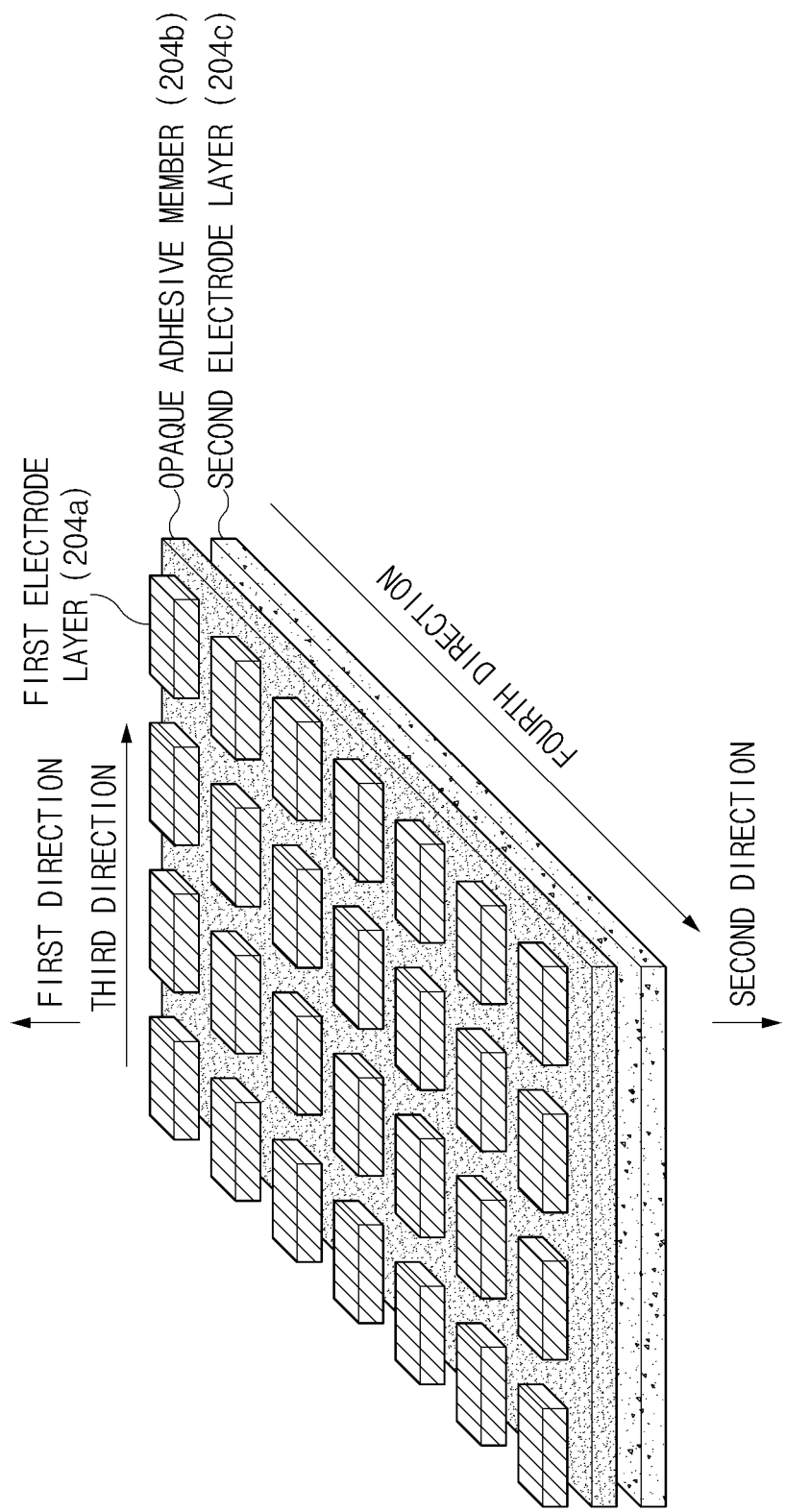
FIG. 4A is an perspective view illustrating the stacked structure of a force sensor according to an embodiment.
Figure 4B:
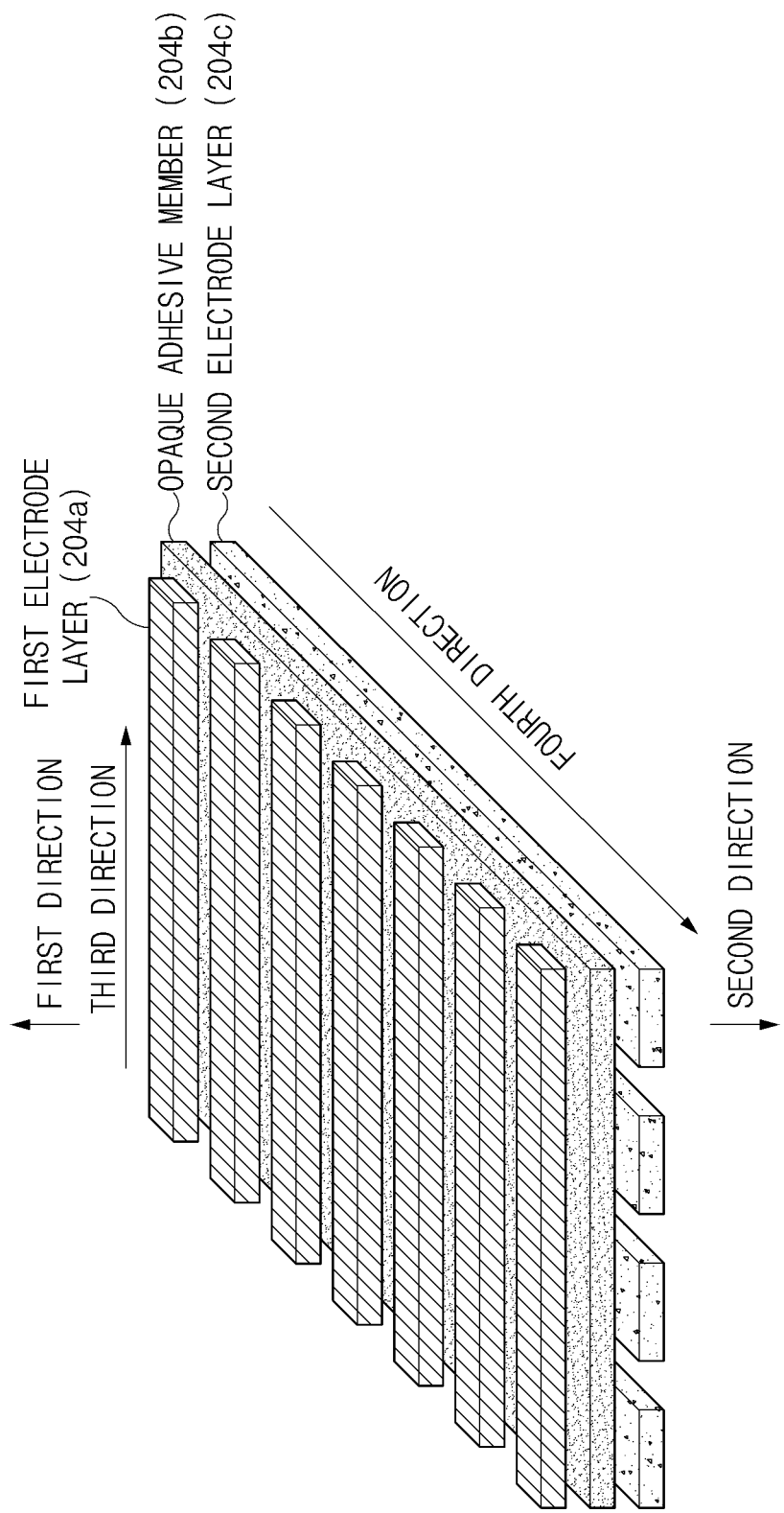
FIG. 4B is an perspective view illustrating the stacked structure of a force sensor according to another embodiment.

FIG. 4A is a perspective view illustrating the stacked structure of the force sensor 204 according to an embodiment. FIG. 4B illustrating the stacked structure of the force sensor 204 according to another embodiment.

Referring to FIG. 4A, the opaque adhesive member 204b may include a first surface facing the first direction and a second surface facing the second direction. The first electrode layer 204a may include a plurality of electrodes that are arranged in an array in the third direction that extends in parallel with the second surface and the fourth direction that is perpendicular to the third direction. The plurality of electrodes in the first electrode layer 204a may be spaced apart from each other by a predetermined interval.

The second electrode layer 204c according to an embodiment of the present disclosure may be disposed on the second surface of the opaque adhesive member 204b. The force sensor 204 illustrated in FIG. 4A may use self-capacitance (self-cap) to detect pressures on the transparent member 102. In a self-capacitance scheme, the force sensor 204 may detect variations in capacitance between an electrode layer, to which a stimulation signal is applied, and a ground electrode layer. For example, the force sensor 204 may detect capacitance variation by detecting distortions of the stimulation signal caused by the pressure exerted on the transparent member 102.

In another embodiment, referring to FIG. 4B, the first electrode layer 204a may include a plurality of electrodes extending in the third direction. The plurality of electrodes of the first electrode layer 204a may be spaced apart from each other in the fourth direction by a predetermined interval. The second electrode layer 204c may be disposed on the surface of the opaque adhesive member 204b facing the second direction. The second electrode layer 204c may include a plurality of electrodes extending in the fourth direction, which is perpendicular to the third direction. The plurality of electrodes of the second electrode layer 204c may be spaced apart from each other in the third direction by a predetermined interval. The force sensor 204 illustrated in FIG. 4B may use mutual-capacitance (mutual-cap) to detect pressures on the transparent member 102. In a mutual-capacitance scheme, the force sensor 204 may detect magnitude of pressures based on variations in capacitance between a first electrode layer (e.g. the first electrode layer 204a), where a transmit signal is applied, and a second electrode layer (e.g. the second electrode layer 204c), where a receive signal is applied.

Figure 5A:
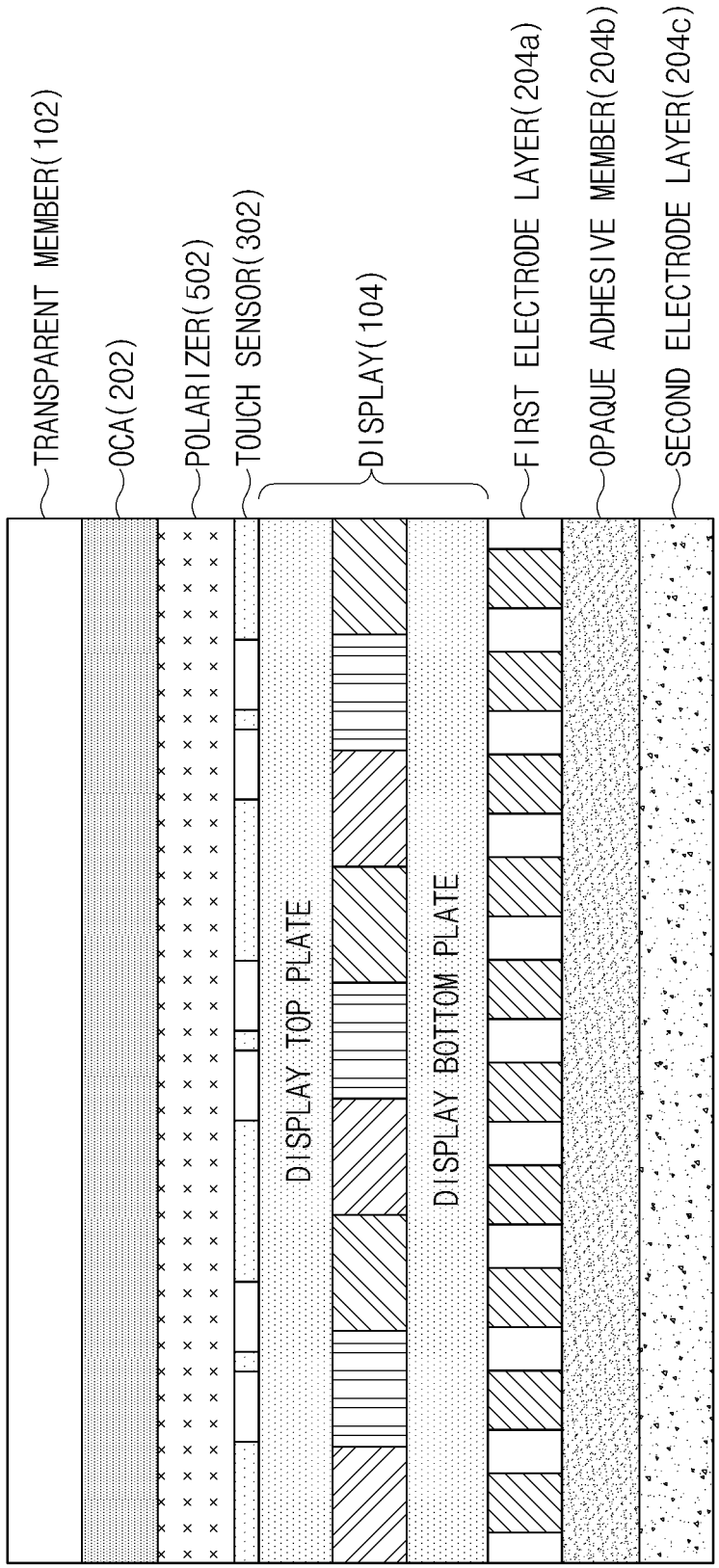
FIG. 5A is a sectional view of the stacked structure according to an embodiment in which a touch sensor is interposed between a polarizer and a display.
Figure 5B:
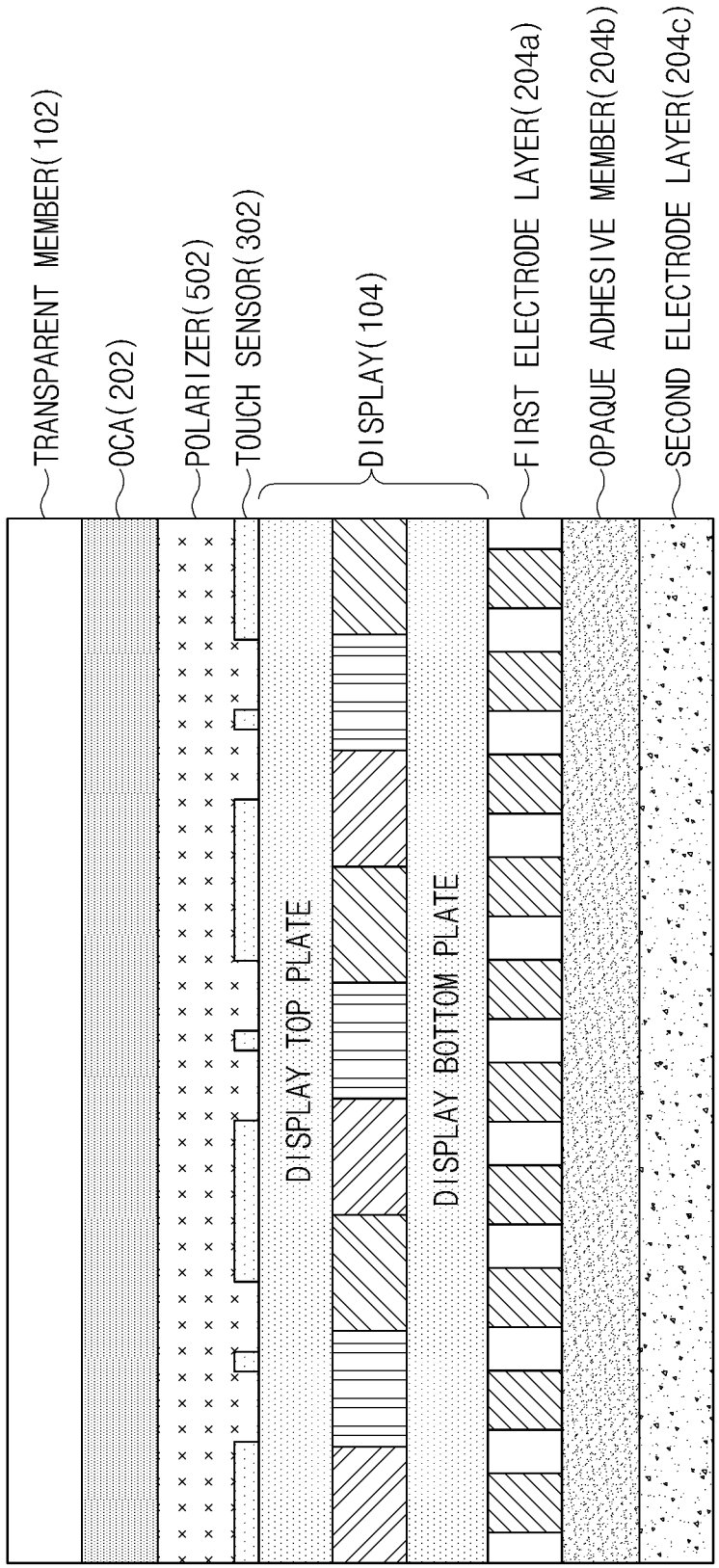
FIG. 5B is a sectional view of the stacked structure according to an embodiment in which a touch sensor is disposed in the interior of a polarizer.
Figure 5C:
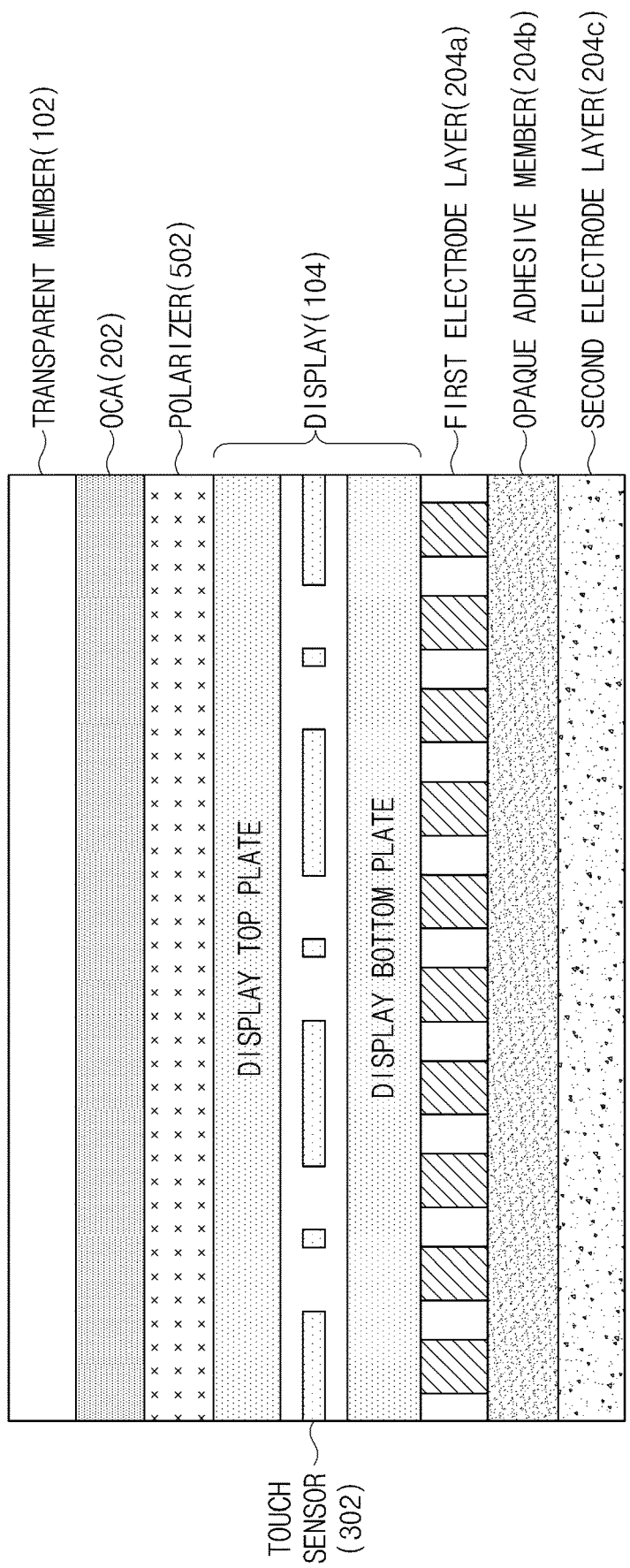
FIG. 5C is a sectional view of the stacked structure according to an embodiment in which a touch sensor is disposed in the interior of a display.
Figure 5D:
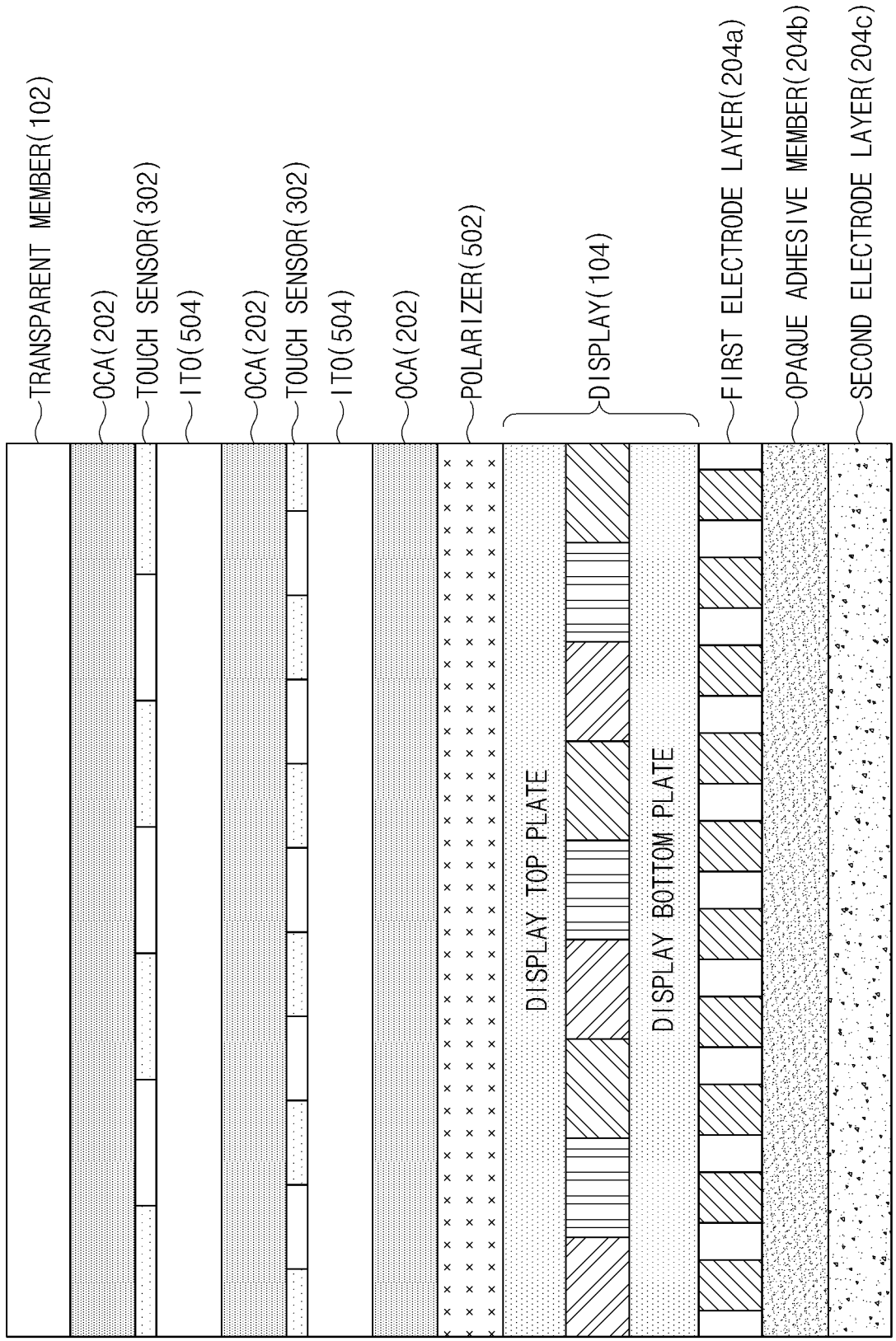
FIG. 5D is a sectional view of the stacked structure according to an embodiment in which a touch sensor is disposed in two layers.
Figure 5E:
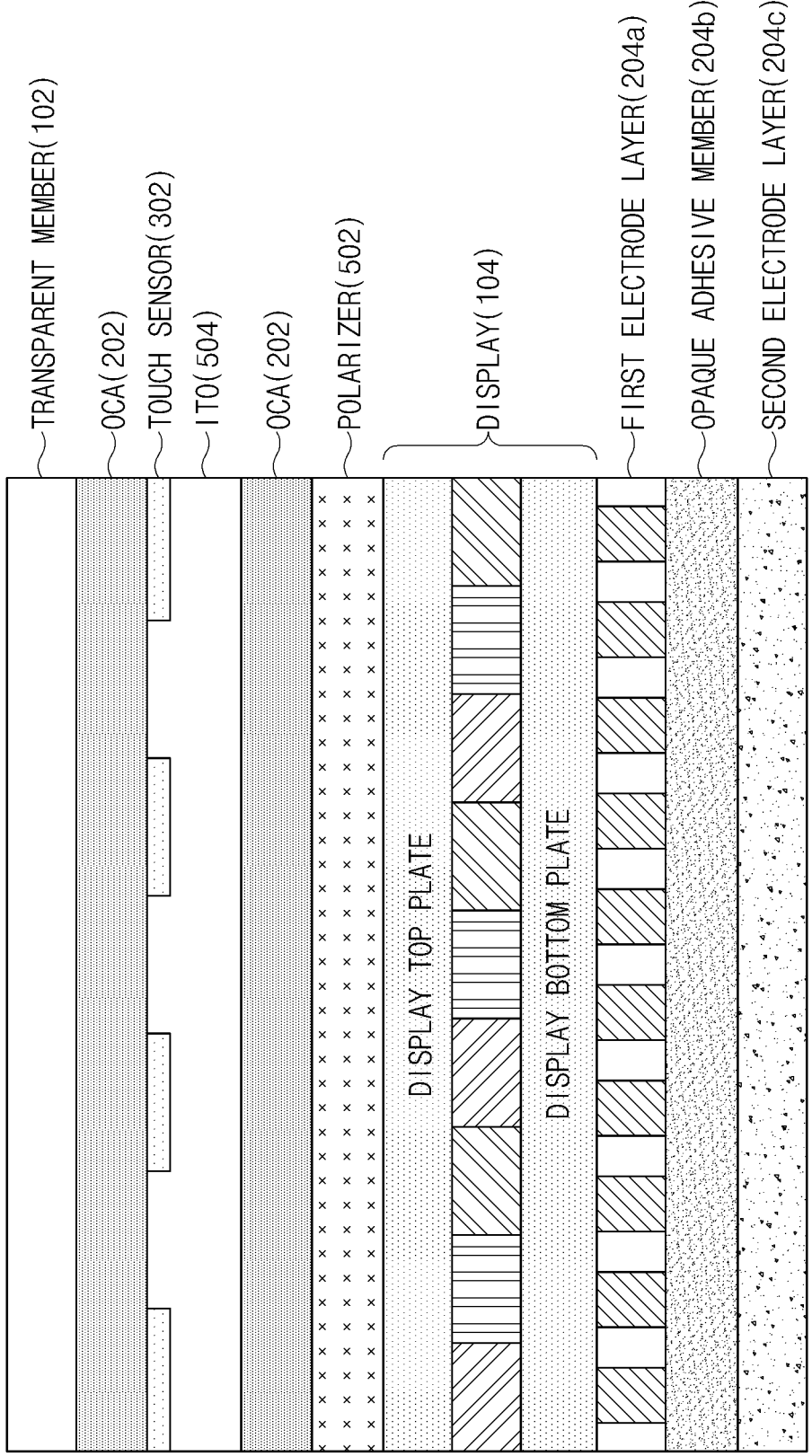
FIG. 5E is a sectional view of the stacked structure according to an embodiment in which a touch sensor is interposed between a transparent member and an ITO layer.
Figure 5F:
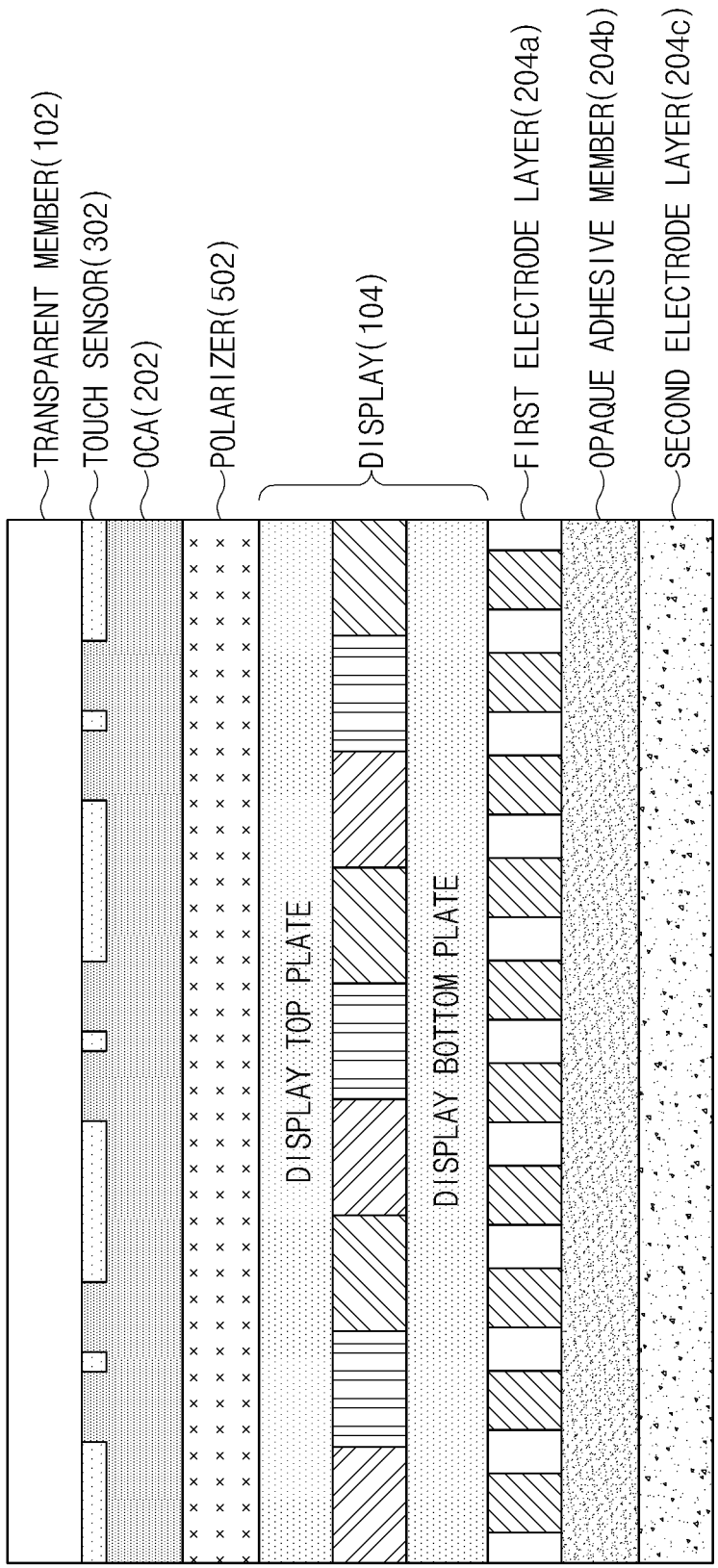
FIG. 5F is a sectional view of the stacked structure according to an embodiment in which a touch sensor is disposed under a transparent member.
Figure 5G:
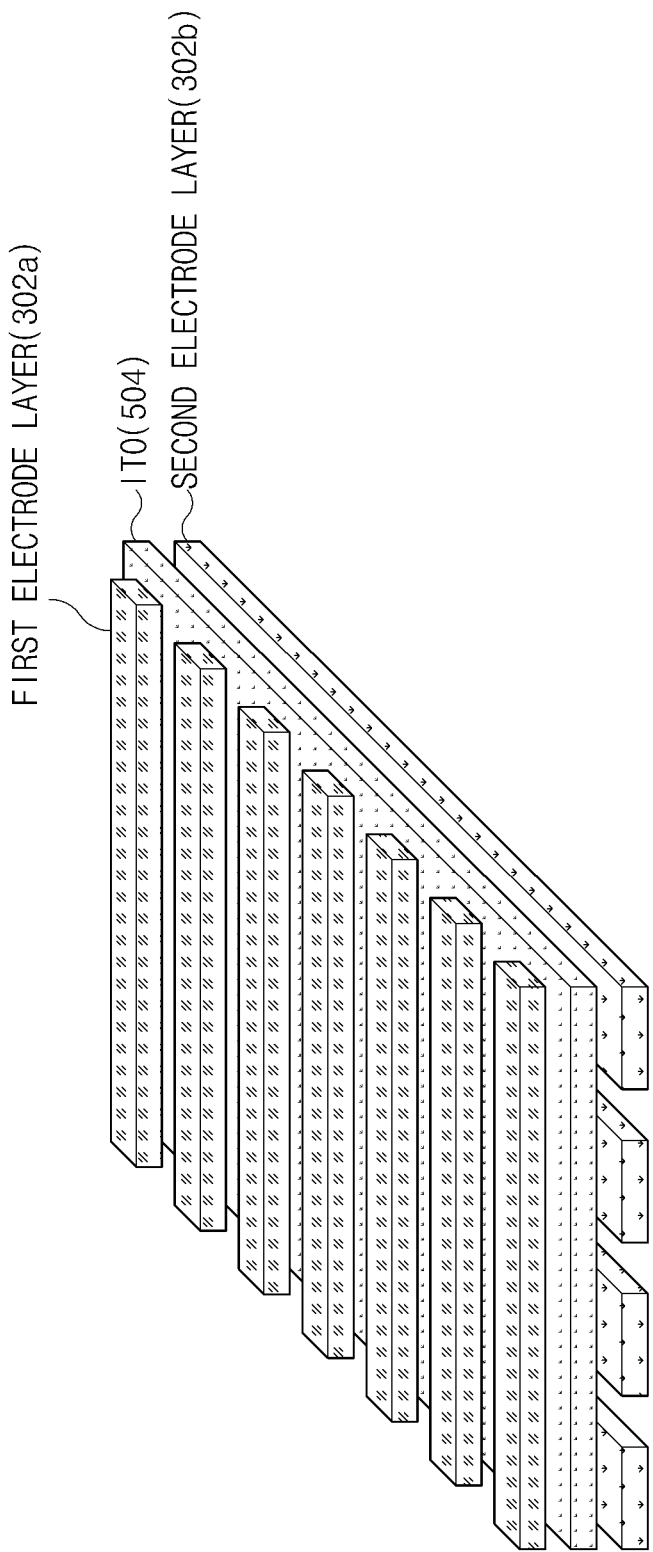
FIG. 5G is a perspective view illustrating the stacked structure of a touch sensor according to an embodiment.
Figure 5H:
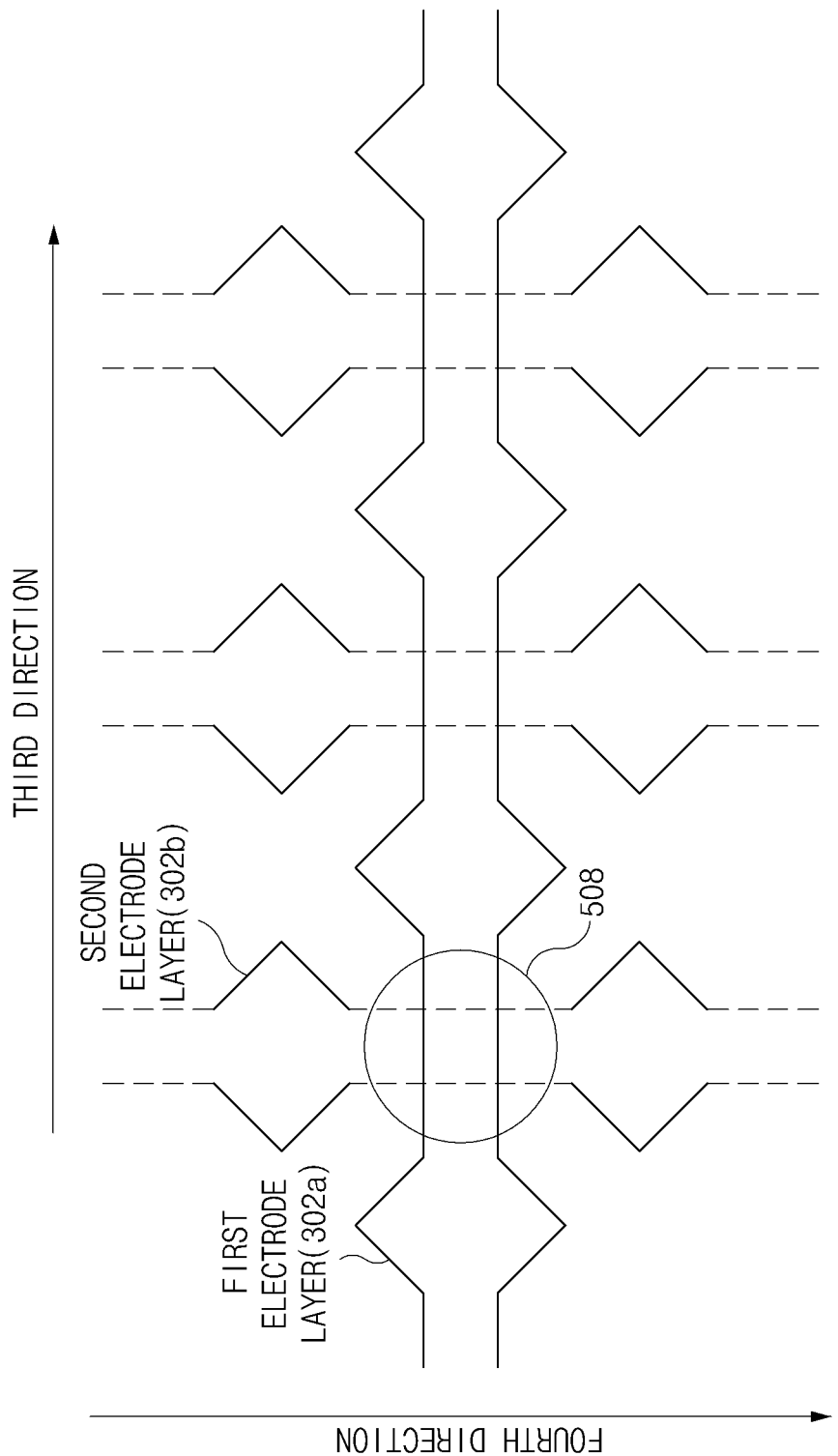
FIG. 5H is a schematic diagram illustrating the stacked structure of a touch sensor according to another embodiment.

FIG. 5A is a sectional view of the stacked structure according to an embodiment in which a touch sensor is interposed between a polarizer and a display. FIG. 5B is a sectional view of the stacked structure according to an embodiment in which a touch sensor is disposed in the interior of a polarizer. FIG. 5C is a sectional view of the stacked structure according to an embodiment in which a touch sensor is disposed in the interior of a display. FIG. 5D is a sectional view of the stacked structure according to an embodiment in which a touch sensor is disposed in two layers. FIG. 5E is a sectional view of the stacked structure according to an embodiment in which a touch sensor is interposed between a transparent member and an ITO layer. FIG. 5F is a sectional view of the stacked structure according to an embodiment in which a touch sensor is disposed under a transparent member. FIG. 5G is a perspective view illustrating the stacked structure of a touch sensor according to an embodiment. FIG. 5H is a schematic diagram illustrating the stacked structure of a touch sensor according to another embodiment.

Referring to FIGS. 5A to 5F, the electronic device 100 may further include a polarizer 502 and a touch sensor 302. The polarizer 502 may selectively pass only a component of light emitted from the display 104 that is polarized in one direction. Also, the polarizer 502 may selectively pass only a component of external light incident on the display 104. After the component of external light passes through the polarizer 502, it may be is repeatedly reflected between the polarizer 502 and the display 104. In doing so, the polarizer 502 may further absorb or block components of the passed external light. Accordingly, the polarizer 502 may improve the visibility of the display 104. The touch sensor 302 may sense the locations of touch inputs (e.g., actual touches, touch gestures, hovering inputs, force touch inputs, or the like) of an object (e.g., the user's finger) to the transparent member 102.

Referring to FIG. 5A, the touch sensor 302 may be disposed on the first surface of the display 104, and the polarizer 502 may be disposed over the touch sensor 302 in the first direction. Referring to FIG. 5B, the polarizer 502 may be disposed on the first surface of the display 104, and the touch sensor 302 may be embedded within the polarizer 502. The electronic device 100 illustrated in FIGS. 5A and 5B may be referred to as an on-cell type, which means that the touch sensor 302 may be directly deposited on the display panel 104.

Referring to FIG. 5C, the touch sensor 302 may be interposed between the first surface (top plate) and the second surface (bottom plate) of the display 104. The polarizer 502 may be disposed on the first surface of the display 104. The electronic device 100 illustrated in FIG. 5C may be referred to as an in-cell type, which means that the touch sensor is integrated in the display 104. When the electronic device is of the in-cell type, since the drivers of display 104 and touch sensor 302 are also integrated, space saving may be achieved and the thickness of the electronic device 100 may be reduced.

Referring to FIG. 5D, the polarizer 502 may be disposed on the first surface of the display 104, and the touch sensor 302 may be disposed over the polarizer 502 in the first direction. Referring to FIG. 5E, the touch sensor 302 may be interposed between the transparent member 102 and an ITO layer 504. Referring to FIG. 5F, the touch sensor 302 may be disposed on the surface of the transparent member 102 facing the second direction, and the polarizer 502 may be disposed on the first surface of the display 104. The electronic devices 100 illustrated in FIGS. 5D to 5F may be referred to as an add-on type, which means that the touch sensor is be added on the display panel 104. The touch sensor of an add-on type electronic device may have high touch sensitivity. In addition, the manufacturing process for add-on type electronic devices may be relatively simple.

The touch sensor 302 illustrated in FIG. 5D may be separately implemented in two layers, and the touch sensor illustrated in FIG. 5G may be the same as the touch sensor 302 illustrated in FIG. 5D. The touch sensor illustrated in FIG. 5H may be implemented in one layer, and the touch sensor illustrated in FIG. 5H may be the same as the touch sensor 302 illustrated in FIG. 5E. In the touch sensor illustrated in FIG. 5H, a first electrode layer 302a may consist of electrodes extending in the third direction, and a second electrode layer 302b may consist of electrodes extending in the fourth direction perpendicular to the third direction. The electrodes including the second electrode layer 302b may be extended after an area 508 is etched. The area 508 may be a point where electrodes of the first and second electrode layers intersect with one another. The electrodes of the first electrode layer 302a and the electrodes of the second electrode layers 302b may not be in electrical contact with each other. Since the touch sensor illustrated in FIG. 5G is separately implemented in two layers, the manufacturing process for the touch sensor may be relatively simple. And since the touch sensor illustrated in FIG. 5H is implemented in one layer, the thickness of the touch sensor may be reduced. A designer may choose between the touch sensor illustrated in FIG. 5G and the touch sensor illustrated in FIG. 5H depending on whether ease of manufacture is more important than keeping the touch sensor thin.

In an embodiment, each of the first electrode layer 302a and the second electrode layer 302b may include ITO, IZO, PEDOT, Ag nanowire, metal mesh, graphene, and/or transparent polymer conductors. Either the first electrode layer 302a or the second electrode layer 302b may be the ground layer, and implementations of the first electrode layer 302a and the second electrode layer 302b are not limited to the above-described example.

Figure 6A:
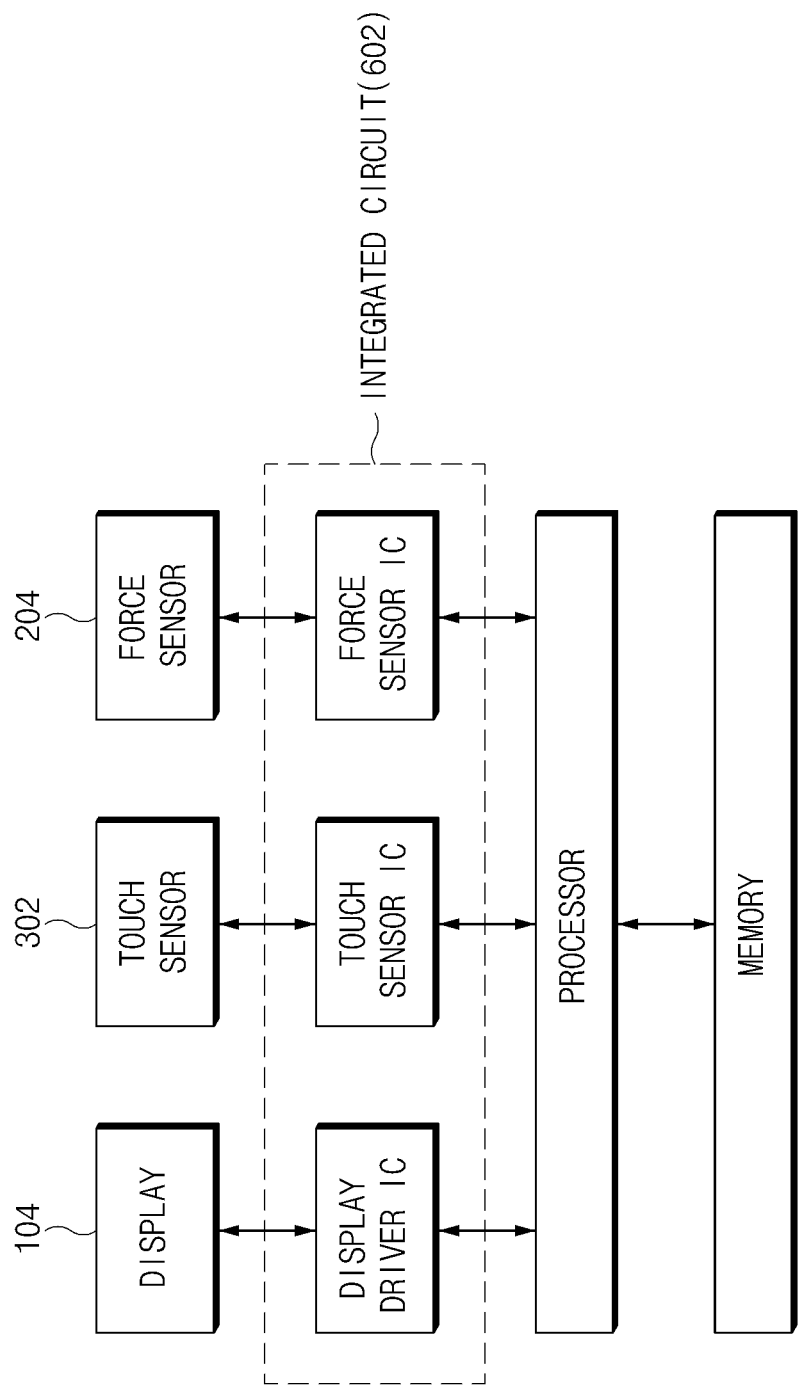
FIG. 6A is a block diagram of an electronic device according to an embodiment.

FIG. 6A is a block diagram an electronic device according to an embodiment.

Figure 6B:
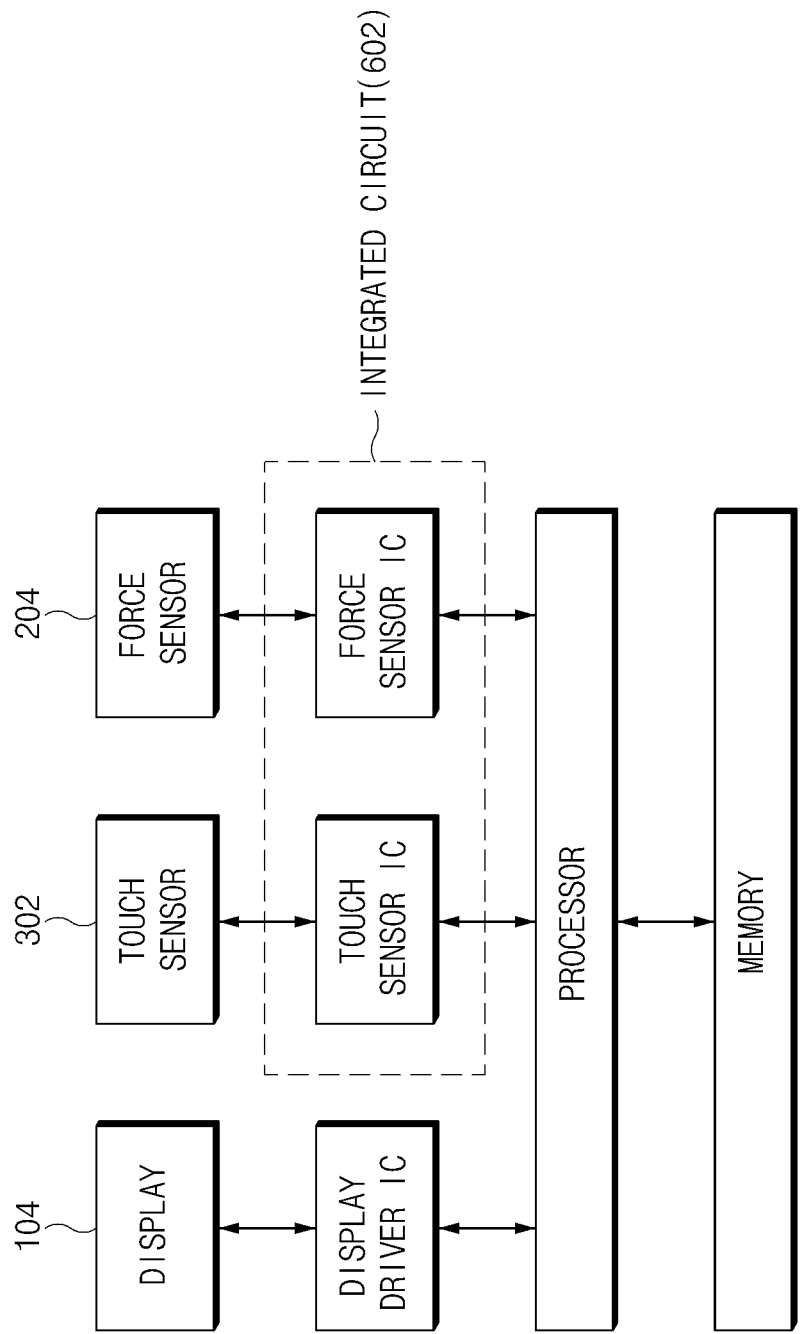
FIG. 6B is a block diagram of an electronic device according to another embodiment.
Figure 6C:
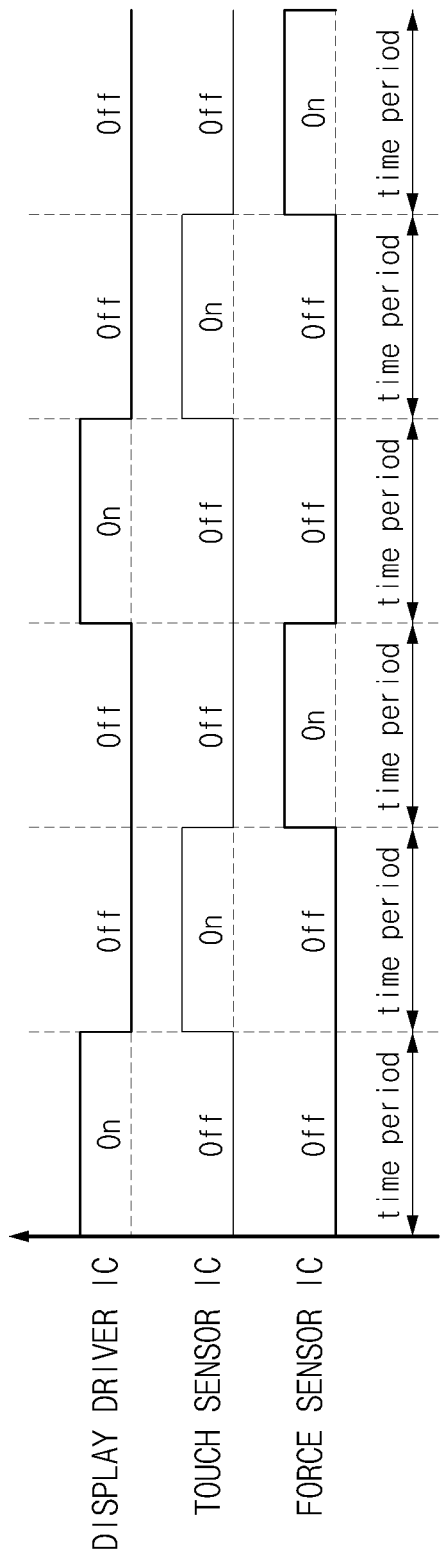
FIG. 6C, FIG. 6D, and FIG. 6E are timing diagrams showing how various integrated circuits according to various embodiments control a display, a touch sensor, and a force sensor.
Figure 6D:
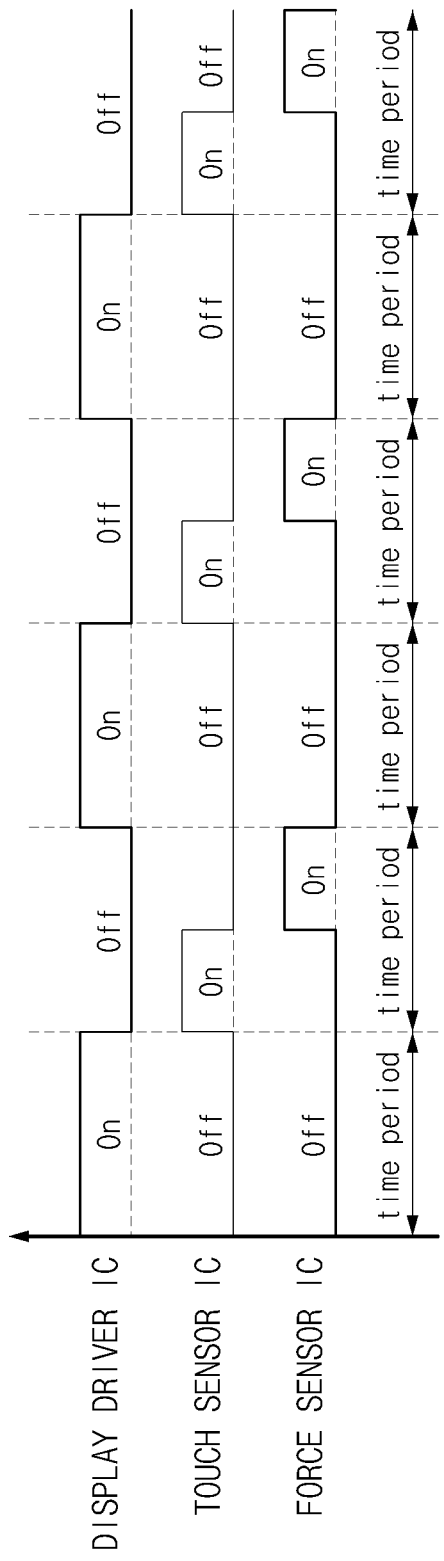
Figure 6E:
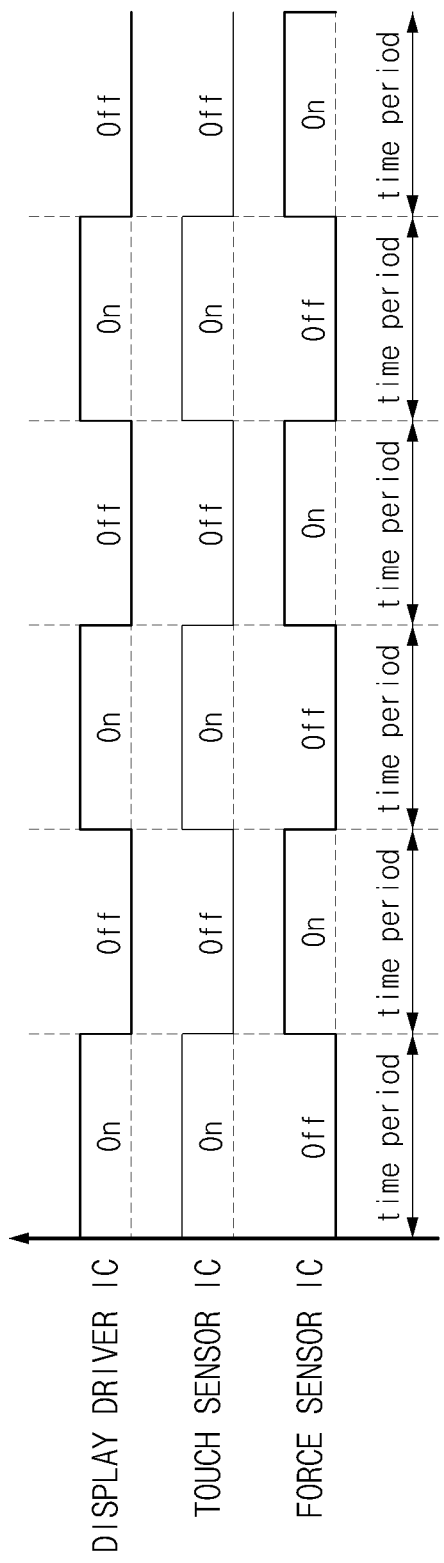

FIG. 6B is a block diagram of an electronic device according to another embodiment. FIGS. 6C to 6E are timing diagrams showing how various integrated circuits 602 according to various embodiments control the display 104, the touch sensor 302, and the force sensor 204.

Referring to FIGS. 6A and 6B, the electronic device 100 may further include the integrated circuit 602, a processor, and a memory.

The integrated circuit 602 according to an embodiment of the present disclosure may include a display driver IC, a touch sensor IC, and/or a force sensor IC. In one example, at least two of the display driver IC, the touch sensor IC, and the force sensor IC may be implemented with one integrated circuit 602, and the third driver IC may be implemented as a separate integrated circuit. The integrated circuit 602 is illustrated in FIG. 6A as including the display driver IC, the touch sensor IC, and the force sensor IC. However, as illustrated in FIG. 6B, the integrated circuit 602 may include only the touch sensor IC and the force sensor IC. Alternatively, the integrated circuit 602 may include the display driver IC and the touch sensor IC or may include the display driver IC and the force sensor IC.

The display driver IC according to an embodiment of the present disclosure may be connected to the display 104 and the processor and may control driving timing of the display 104 under the control of the processor. The touch sensor IC may be connected to the touch sensor 302 and the processor and may control driving timing of the touch sensor 302 under the control of the processor. The force sensor IC may be connected to the force sensor 204 and the processor and may control driving timing of the force sensor 204 under the control of the processor.

The processor according to an embodiment of the present disclosure may control the integrated circuit 602 and may be mounted on the printed circuit board 110. The processor may control the integrated circuit 602 when executing instructions stored in the memory.

Referring to FIG. 6C, the processor may control the driving timing of the display 104, the touch sensor 302, and the force sensor 204 so that their respective driving timing can be different from each other. For example, the processor may control the display 104 to drive during one time period and may control the touch sensor 302 to detect touch inputs during the following time period. If a touch input is detected by the touch sensor 302 during the following time period, the processor may control the force sensor 204 to detect a force input of the touch input during a next time period of the following time period.

However, embodiments of the present disclosure are not limited to the order described above. For example, the processor may operate in the order of operating the touch sensor 302 first, the display 104 second, and the force sensor 204 third. According to an embodiment of the present disclosure, signal interference between adjacent electrode layers may decrease by the display 104, the touch sensor 302, and the force sensor 204 are driven at different times.

Referring to FIG. 6D, the processor may control the display 104 to drive during one time period and may control the touch sensor 302 to detect touch inputs and the force sensor 204 to detect force inputs during the following time period. Alternatively, the processor may control the touch sensor 302 to detect touch inputs during one time period and may control the display 104 to drive and the force sensor 204 to detect force inputs during the following time period.

If the time period referenced above are short, sensitivity of the sensors may be better, i.e., the response speed of the sensors may be better. For example, the display driver IC may be only on for one out of every three time periods, as illustrated in FIG. 6C. Or, as illustrated in FIG. 6D, the display driver IC may be only on for one out of every two time periods. That is, the processor based on the timing of FIG. 6D may operate the display driver IC more frequently than when it is based on the timing of FIG. 6C. Accordingly, in an electronic device driven according to the timing of FIG. 6D, the response speed of the display 104 may be improved compared with an electronic device driven according to the timing of FIG. 6C.

Also, according to an embodiment of the present disclosure, the amount of time needed for input detection may be allocated depending on the types of elements. For example, the amount of time needed to detect a touch input may be longer than the amount of time needed to detect a pressure input. Accordingly, the processor may turn the touch sensor IC on for longer than the force sensor 204.

Referring to FIG. 6E, the processor may turn the display driver IC and touch sensor IC on during one time period, for example, so that a touch input may be detected. The processor may then turn the force sensor IC on during the following time period. The timing diagram illustrated in FIG. 6E may be used by the add-on type electronic device illustrated in FIGS. 5D to 5F. Compared with on-cell type or in-cell type the electronic devices, the add-on type electronic device may be advantageous in that since the distance between the touch sensor 302 and the display 104 is relatively great, signal interference between the touch sensor 302 and the display 104 may be reduced. Accordingly, as illustrated in FIG. 6E, signal interference may be minimal even though the touch sensor 302 and the display 104 are on during the same time period.

Unlike the timing diagram illustrated in FIG. 6E, the processor may make employ different driving frequencies for the display 104, the touch sensor 302, and the force sensor 204. For example, when the display 104 is driven at 60 Hz and the touch sensor 302 is driven at 50 Hz, frequency interference between the display 104 and the touch sensor 302 may decrease.

Figure 7A:
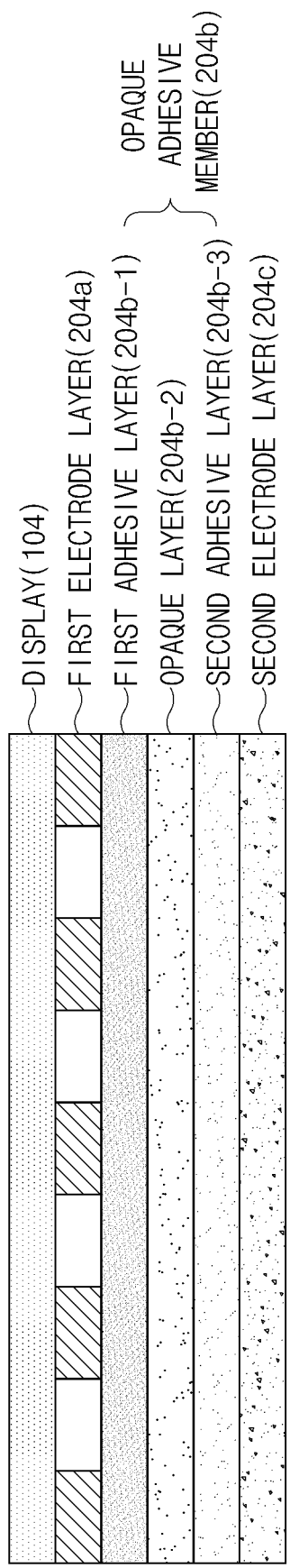
FIG. 7A is a sectional view of the stacked structure according to an embodiment in which a first electrode layer is disposed on a first adhesive layer.
Figure 7B:
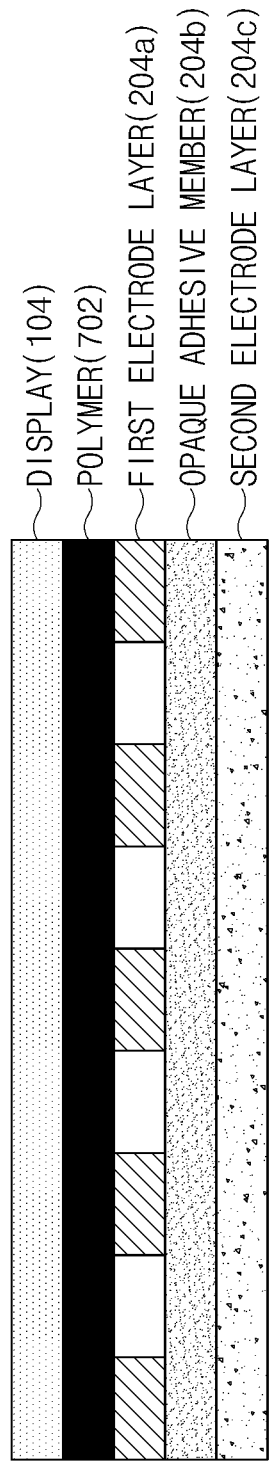
FIG. 7B is a sectional view of the stacked structure according to an embodiment in which a first electrode layer is disposed under a polymer.
Figure 7C:
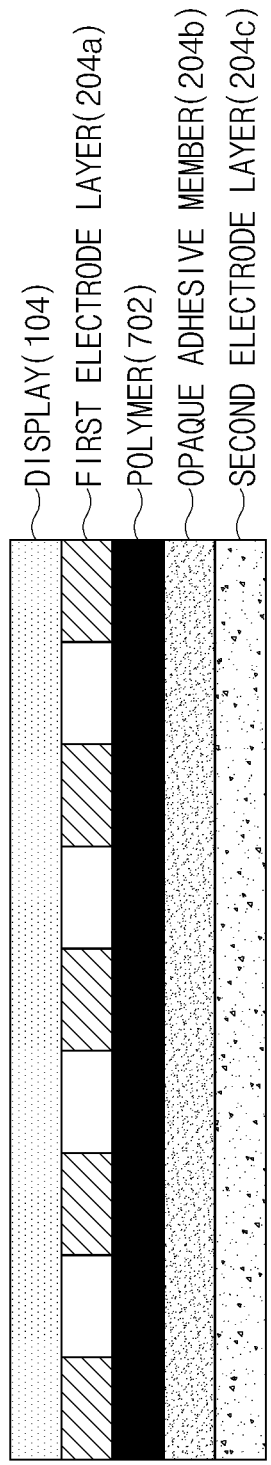
FIG. 7C is a sectional view of the stacked structure according to an embodiment in which a first electrode layer is disposed on a polymer.
Figure 7D:
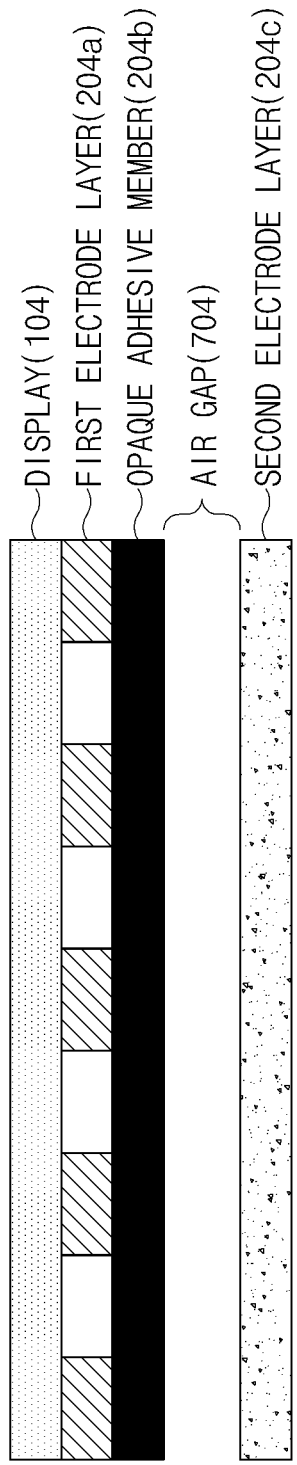
FIG. 7D is a sectional view of the stacked structure according to an embodiment in which an air gap is present between an opaque adhesive member and a second electrode layer.
Figure 7E:
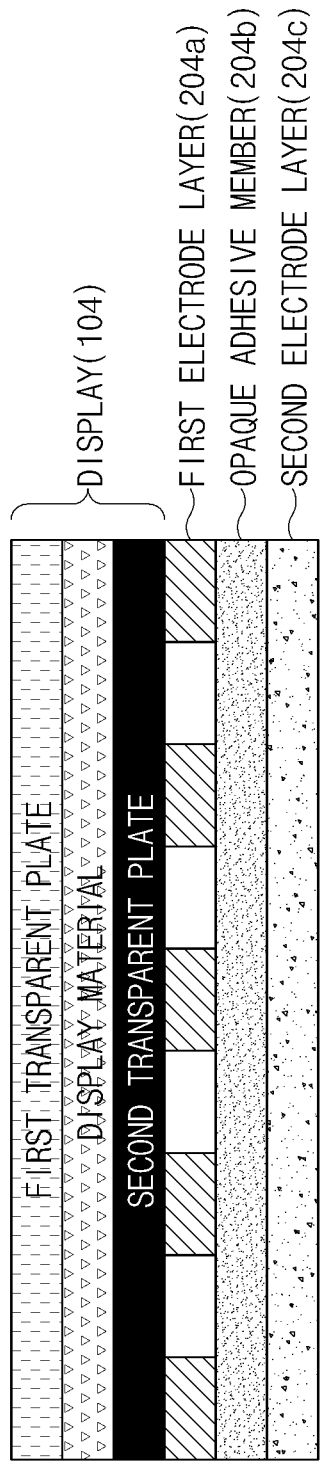
FIG. 7E is a sectional view of the stacked structure according to an embodiment in which a display including a first transparent plate, a display material, and a second transparent plate and a force sensor are coupled to each other.

FIG. 7A is a sectional view of the stacked structure according to an embodiment in which the first electrode layer 204a is disposed on the first adhesive layer 204b-1. FIG. 7B is a sectional view of the stacked structure according to an embodiment in which the first electrode layer 204a is disposed under the polymer 702. FIG. 7C is a sectional view of the stacked structure according to an embodiment in which the first electrode layer 204a is disposed on the polymer 702. FIG. 7D is a sectional view of the stacked structure according to an embodiment in which an air gap 704 is present between the opaque adhesive member 204*b* and the second electrode layer 204*c*. FIG. 7E is a sectional view of the stacked structure according to an embodiment in which a display including a first transparent plate, a display material, and a second transparent plate and a force sensor are coupled to each other.

Referring to FIG. 7A, the opaque adhesive member 204*b* may be a layer including opaque material (e.g., material with black ink) and adhesive material. The opaque material may block light from the display 104 in the second direction. Since the visibility of the graphical displayed on the display 104 decreases when light from the display 104 transmits in the second direction, visibility may be improved by the opaque material in the opaque adhesive member 204*b*. The adhesive material may adhere the first electrode layer 204*a* and the second electrode layer 204*c* to the opaque adhesive member 204*b*. The adhesive material may be clear or opaque adhesive. The first and second electrode layers 204*a* and 204*c* may make contact with first and second surfaces of the opaque adhesive member 204*b*, respectively.

In one embodiment, the opaque adhesive member 204*b* may include a first adhesive layer 204*b*-1, a second adhesive layer 204*b*-3, and an opaque layer 204*b*-2. The first adhesive layer 204*b*-1 may make contact with the first electrode layer 204*a*. The second adhesive layer 204*b*-3 may be on the other side of the opaque layer 204*b*-2 and may make contact with the second electrode layer 204*c*. The first adhesive layer 204*b*-1 and the second adhesive layer 204*b*-3 may be made with the above-described adhesive material. In other words, the first adhesive layer 204*b*-1 and the second adhesive layer 204*b*-3 may use clear or opaque adhesive material. The opaque layer 204*b*-2 may be interposed between the first adhesive layer 204*b*-1 and the second adhesive layer 204*b*-3 and may be made with for example, Ag, Cu, Mg, Ti, Mo, Al, and/or graphene. The opaque layer 204*b*-2 may further include a foamed layer, which allows the opaque layer 204*b*-2 to have excellent deformation characteristics and may protect the force sensor 204 from external impact.

Referring to FIGS. 7B to 7D, the electronic device 100 may further include the polymer 702 or the air gap 704 between the display 104 and the second electrode layer 204*c*.

Referring to FIG. 7B, the polymer 702 may be interposed between the first electrode layer 204*a* and the display 104. Referring to FIG. 7C, the polymer 702 may be interposed between the first electrode layer 204*a* and the opaque adhesive member 204*b*. The polymer 702 may protect the opaque adhesive member 204*b* by preventing metal in the opaque adhesive member 204*b* from being oxidized. Also, when the polymer 702 is interposed between the first electrode layer 204*a* and the opaque adhesive member 204*b*, the polymer 702 may prevent materials from the opaque adhesive member 204*b* from infiltrating into the first electrode layers 204*a*.

Referring to FIG. 7D, the electronic device 100 may include the air gap 704 between the opaque adhesive member 204*b* and the second electrode layer 204*c*. A dielectric may be material that has polarized charge in an electric field. In FIG. 7D, the air gap 704 between the opaque adhesive member 204*b* and the second electrode layer 204*c* may constitute a dielectric.

Referring to FIG. 7E, the display 104 may include a first transparent plate, a display material, and a second transparent plate. In an example, the first transparent plate may be PET (polyethylene terephthalate), and the second transparent plate may be made with a polymer. Alternatively, the first transparent plate and the second transparent plate may be made with same material. Implementations of the first transparent plate and the second transparent plate are not limited to the above-described examples. The display material may be an organic light-emitting material, liquid crystal, quantum dot, or the like. The force sensor 204 may be disposed on the second transparent plate. For example, the first electrode layer 204*a* may be disposed beneath the second transparent plate, and the opaque adhesive member 204*b* may be disposed beneath the first electrode layer 204*a*.

Figure 8:
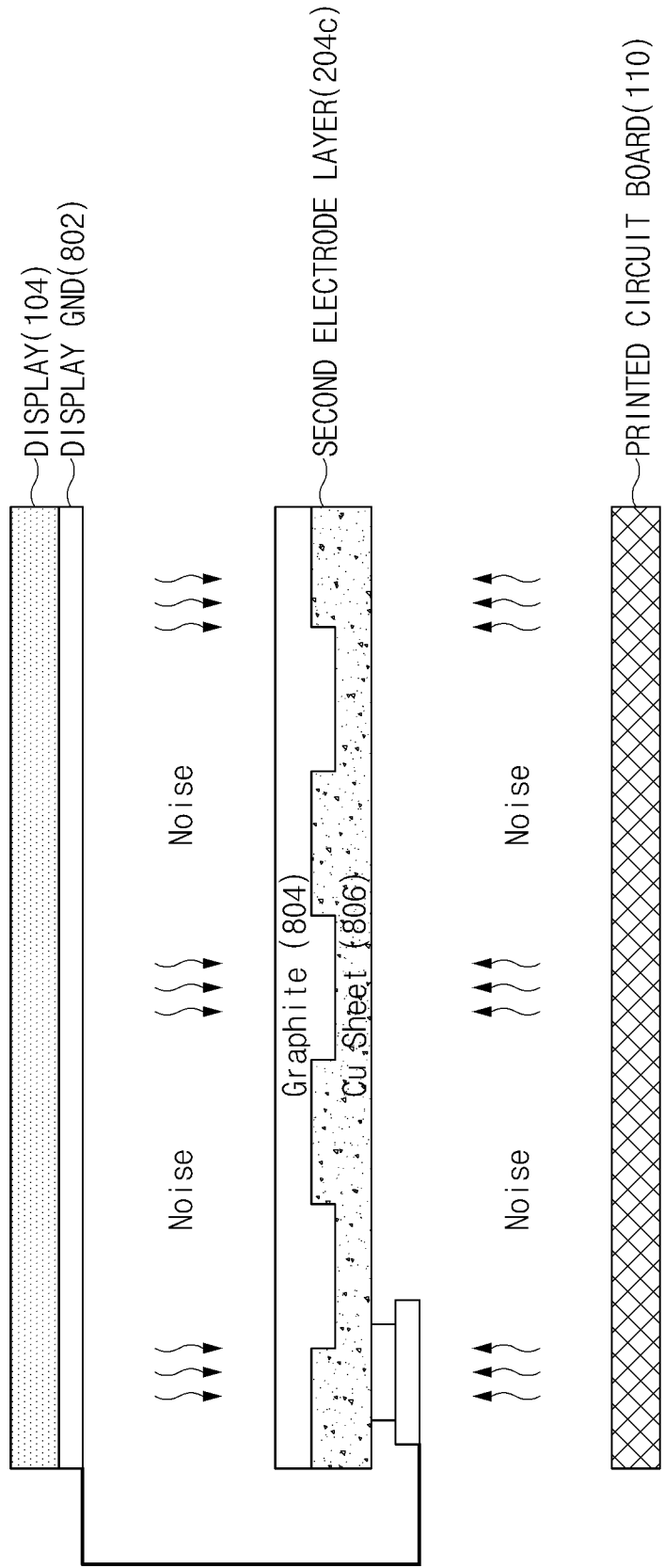
FIG. 8 is a sectional view illustrating how a second electrode layer according to an embodiment shields noise when the second electrode layer is connected to a ground.

FIG. 8 is a sectional view illustrating how the second electrode layer 204*c* according to an embodiment shields noise when the second electrode layer 204*c* is connected to a ground.

Referring to FIG. 8, the electronic device 100 may further include the printed circuit board 110 interposed between the second electrode layer 204*c* and the second surface of the housing. While situated between the display 104 and the printed circuit board 110, the second electrode layer 204*c* may include a material to shield at least some electromagnetic interference between the display 104 and the printed circuit board 110. The shielding material may be Cu or graphite. An embodiment is illustrated in FIG. 8, where the copper sheet 806 is disposed at the bottom of the second electrode layer 204*c* and the graphite layer 804 is disposed at the top. However, embodiments of the present disclosure may so limited. For example, the copper sheet 806 may be disposed at the top, and the graphite layer 804 may be disposed at the bottom.

According to an embodiment of the present disclosure, the second electrode layer 204*c* may be electrically connected to a ground. In one embodiment, the second electrode layer 204*c* may be connected to the ground 802 of the display 104. In FIG. 8, if the second electrode layer 204*c* is connected to the ground 802 of the display 104, at least a portion of noise generated from the printed circuit board 110 and noise generated from the display 104 may be blocked by the grounding of the second electrode layer 204*c*.

In an embodiment, the second electrode layer 204*c* may include a material that dissipates heat generated from the display 104. The material may be a good heat conductor. For example, the second electrode layer 204*c* may include Cu or graphite. When the display 104 is driven, heat may be generated by the display 104. The heat generated by the display 104 may cause abnormal operations of the components mounted on the printed circuit board 110. According to an embodiment of the present disclosure, it may be possible to prevent the abnormal operations when the second electrode layer 204*c* dissipates at least some of the heat generated from the display 104.

Figure 9:
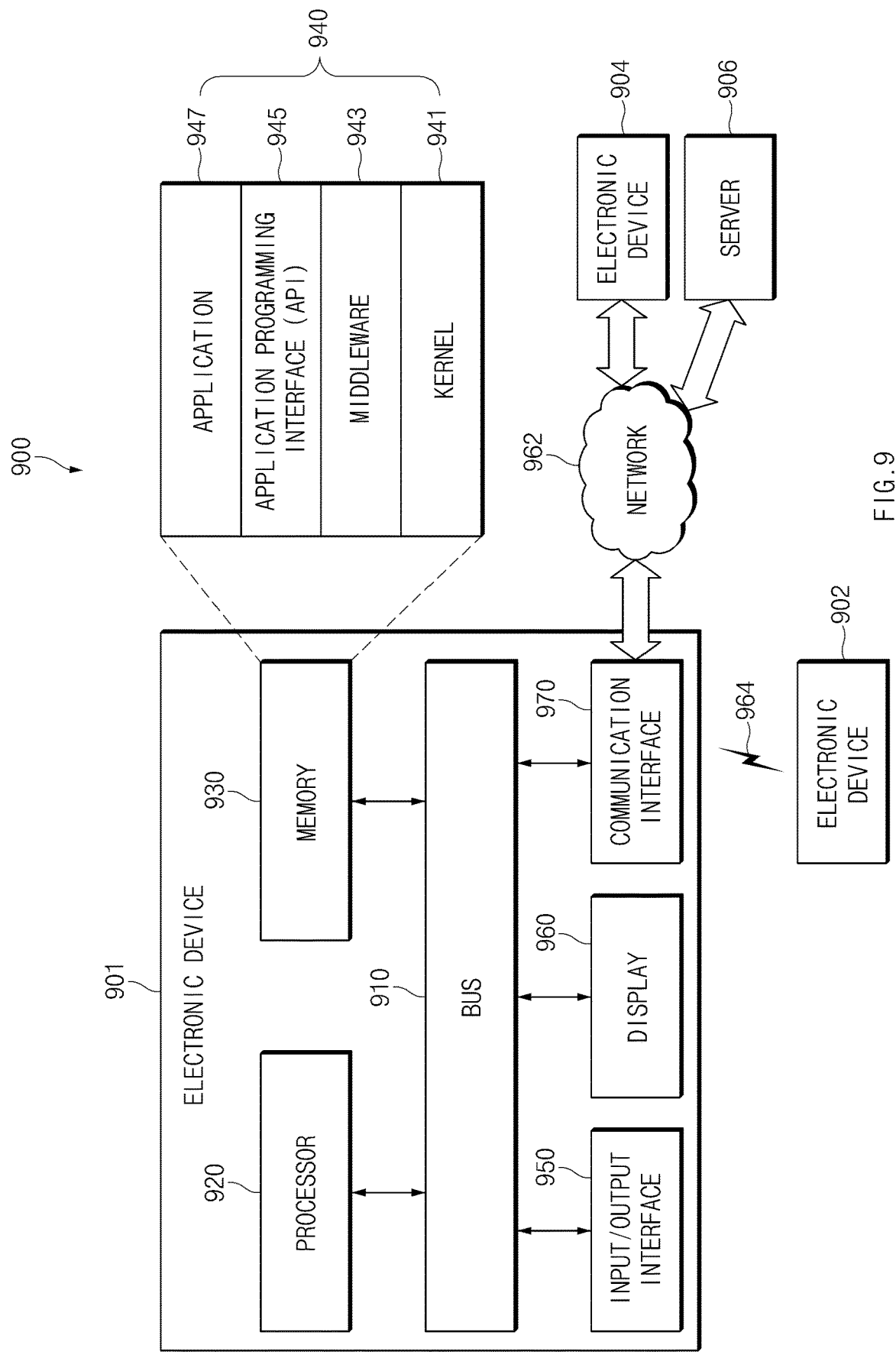
FIG. 9 illustrates an electronic device in a network environment according to an embodiment.

FIG. 9 illustrates an electronic device in a network environment according to an embodiment.

Referring to FIG. 9, according to one embodiment, an electronic device 901, a first electronic device 902, a second electronic device 904, or a server 906 may be connected to each other over a network 962 or local wireless communication 964. The electronic device 901 may include a bus 910, a processor 920, a memory 930, an input/output interface 950, a display 960, and a communication interface 970. According to an embodiment, the electronic device 901 may not include at least one of the above-described elements or may further include other element(s).

For example, the bus 910 may interconnect the above-described elements 910 to 970 and may include a circuit for conveying communications (e.g., a control message and/or data) among the above-described elements.

The processor 920 be a central processing unit (CPU), an application processor (AP), or a communication processor (CP). For example, the processor 920 may perform arithmetic operations or data processing associated with control and/or communication of at least other elements of the electronic device 901.

The memory 930 may be a volatile and/or nonvolatile memory. For example, the memory 930 may store instructions or data associated with at least one other element(s) of the electronic device 901. According to an embodiment, the memory 930 may store software and/or a program 940. The program 940 may include, for example, kernel 941, middleware 943, application programming interface (API) 945, and/or application program (or "an application") 947. At least a part of the kernel 941, the middleware 943, or the API 945 may be referred to as an "operating system (OS)".

For example, the kernel 941 may control or manage system resources (e.g., the bus 910, the processor 920, the memory 930, and the like) that are used to execute operations or functions of other programs (e.g., the middleware 943, the API 945, and the application program 947). Furthermore, the kernel 941 may provide an interface that allows the middleware 943, the API 945, or the application program 947 to access discrete elements of the electronic device 901 so as to control or manage system resources.

The middleware 943 may perform, for example, a mediation role such that the API 945 or the application program 947 communicates with the kernel 941 to exchange data.

Furthermore, the middleware 943 may process one or more task requests received from the application program 947 according to a priority. For example, the middleware 943 may assign the priority, which makes it possible to use a system resource (e.g., the bus 910, the processor 920, the memory 930, or the like) of the electronic device 901, to at least one of the application program 947. For example, the middleware 943 may process the one or more task requests according to the priority, which makes it possible to perform scheduling or load balancing of the one or more task requests.

The API 945 may be, for example, an interface through which the application program 947 controls a function provided by the kernel 941 or the middleware 943, and may include, for example, at least one interface or function (e.g., an instruction) for a file control, a window control, image processing, a character control, or the like.

The input/output interface 950 may be an interface which transmits an instruction or data input from a user or another external device, to other element(s) of the electronic device 901. Furthermore, the input/output interface 950 may output instructions or data, received from other element(s) of the electronic device 901, to the user or another external device.

The display 960 may be a liquid crystal display (LCD), a light-emitting diode (LED) display, an organic LED (OLED) display, a microelectromechanical systems (MEMS) display, or an electronic paper display, etc. The display 960 may display, for example, various contents (e.g., a text, an image, a video, an icon, a symbol, and the like) to the user. The display 960 may include a touch screen and may receive, for example, touch, gesture, proximity, or hovering input using an electronic pen or a part of the user's body.

The communication interface 970 may establish communication between the electronic device 901 and an external device (e.g., the first electronic device 902, the second electronic device 904, or the server 906). For example, the communication interface 970 may be connected to the network 962 over wireless communication or wired communication to communicate with the external device (e.g., the second electronic device 904 or the server 906).

The wireless communication may use at least one of, for example, long-term evolution (LTE), LTE Advanced (LTE-A), Code Division Multiple Access (CDMA), Wideband CDMA (WCDMA), Universal Mobile Telecommunications System (UMTS), Wireless Broadband (WiBro), Global System for Mobile Communications (GSM), or the like, as cellular communication protocol. Furthermore, the wireless communication may include, for example, the local wireless communication 964. The local wireless communication 964 may include at least one of wireless fidelity (Wi-Fi), Bluetooth, near field communication (NFC), magnetic stripe transmission (MST), a global navigation satellite system (GNSS), or the like.

The MST may generate a pulse in response to transmission data using an electromagnetic signal, and the pulse may generate a magnetic field signal. The electronic device 901 may transfer the magnetic field signal to point of sale (POS), and the POS may detect the magnetic field signal using a MST reader. The POS may recover the data by converting the detected magnetic field signal to an electrical signal.

The GNSS may be, for example, a global positioning system (GPS), a global navigation satellite system (Glonass), a Beidou navigation satellite system (hereinafter referred to as "Beidou"), or an European global satellite-based navigation system (hereinafter referred to as "Galileo"). The GNSS may be selected based on the available region, the selected bandwidth, or the like. Hereinafter, in this disclosure, "GPS" and "GNSS" may be interchangeably used. The wired communication may employ, for example, universal serial bus (USB), high definition multimedia interface (HDMI), recommended standard-232 (RS-232), plain old telephone service (POTS), or the like. The network 962 may include a telecommunications network such as a computer network (e.g., LAN or WAN), the Internet, or a telephone network.

Each of the first and second electronic devices 902 and 904 may be different from or the same as that of the electronic device 901. According to an embodiment, the server 906 may include a group of one or more servers. According to one embodiment, all or a portion of operations that the electronic device 901 will perform may be executed by another electronic device (e.g., the first electronic device 902, the second electronic device 904 or the server 906). According to an embodiment, in the case where the electronic device 901 executes a function or service automatically or in response to a request, the electronic device 901 may not perform the function or the service internally, but, alternatively additionally, it may request at least a portion of the function or service be performed by another electronic device (e.g., the electronic device 902 or 904 or the server 906). The other electronic device may execute the requested function and may transmit the execution result to the electronic device 901. The electronic device 901 may provide the requested function or service using the received result or may additionally process the received result to provide the requested function or service. To this end, for example, cloud computing, distributed computing, or client-server computing may be used.

Figure 10:
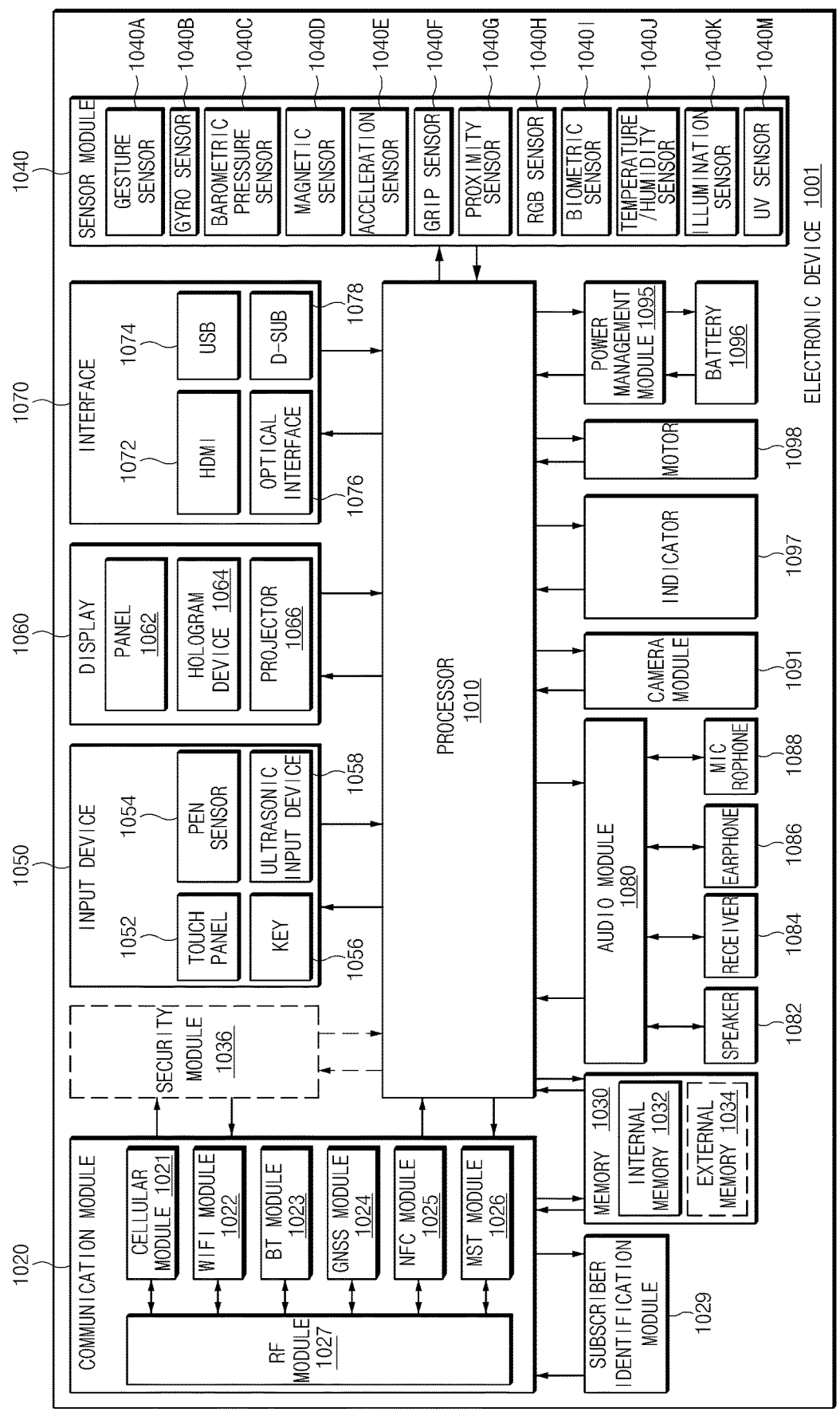
FIG. 10 illustrates a block diagram of an electronic device according to an embodiment.

FIG. 10 illustrates a block diagram of an electronic device according to an embodiment.

Referring to FIG. 10, an electronic device 1001 may include, for example, all or a part of the electronic device 901 illustrated in FIG. 9. The electronic device 1001 may include one or more processors (e.g., an application processor (AP)) 1010, a communication module 1020, a subscriber identification module 1029, a memory 1030, a sensor module 1040, an input device 1050, a display 1060, an interface 1070, an audio module 1080, a camera module 1091, a power management module 1095, a battery 1096, an indicator 1097, and a motor 1098.

The processor 1010 may drive, for example, an operating system (OS) or an application to control a plurality of hardware or software elements connected to the processor 1010 and may process and compute a variety of data. For example, the processor 1010 may be implemented with a System on Chip (SoC). According to an embodiment, the processor 1010 may further include a graphic processing unit (GPU) and/or an image signal processor. The processor 1010 may include at least a part (e.g., a cellular module 1021) of elements illustrated in FIG. 10. The processor 1010 may load an instruction or data, which is received from at least one of other elements (e.g., a nonvolatile memory), into a volatile memory and process the loaded instruction or data. The processor 1010 may store a variety of data in the nonvolatile memory. The processor 210 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed under the provisions of 35 U.S.C. 112, sixth paragraph, unless the element is expressly recited using the phrase "means for". In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

The communication module 1020 may be configured the same as or similar to the communication interface 970 of FIG. 9. The communication module 1020 may include a cellular module 1021, a Wi-Fi module 1022, a Bluetooth (BT) module 1023, a GNSS module 1024 (e.g., a GPS module, a Glonass module, a Beidou module, or a Galileo module), a near field communication (NFC) module 1025, a MST module 1026 and a radio frequency (RF) module 1027.

The cellular module 1021 may provide, for example, voice communication, video communication, Internet service, or the like over a communication network. According to an embodiment, the cellular module 1021 may perform discrimination and authentication of the electronic device 1001 within the communication network by using the subscriber identification module (e.g., a SIM card) 1029. According to an embodiment, the cellular module 1021 may perform at least a portion of functions that the processor 1010 provides. According to an embodiment, the cellular module 1021 may include a communication processor (CP).

Each of the Wi-Fi module 1022, the BT module 1023, the GNSS module 1024, the NFC module 1025, or the MST module 1026 may include a processor for processing data exchanged through the corresponding module, for example. According to an embodiment, at least some (e.g., two or more) of the cellular module 1021, the Wi-Fi module 1022, the BT module 1023, the GNSS module 1024, the NFC module 1025, or the MST module 1026 may be included within one Integrated Circuit (IC) or an IC package.

For example, the RF module 1027 may transmit and receive a communication signals (e.g., RF signals). For example, the RF module 1027 may include a transceiver, a power amplifier module (PAM), a frequency filter, a low noise amplifier (LNA), an antenna, or the like. According to another embodiment, at least one of the cellular module 1021, the Wi-Fi module 1022, the BT module 1023, the GNSS module 1024, the NFC module 1025, or the MST module 1026 may transmit and receive RF signals through a separate RF module.

The subscriber identification module 1029 may be for example, a card and/or an embedded SIM that includes the subscriber identification module and may include unique identify information (e.g., integrated circuit card identifier (ICCID)) or subscriber information (e.g., international mobile subscriber identity (IMSI)).

The memory 1030 (e.g., the memory 930) may include an internal memory 1032 or an external memory 1034. For example, the internal memory 1032 may be a volatile memory (e.g., a dynamic random access memory (DRAM), a static RAM (SRAM), a synchronous DRAM (SDRAM), or the like), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory), or the like), a hard drive, or a solid state drive (SSD).

The external memory 1034 may further be a flash drive such as compact flash (CF), secure digital (SD), micro secure digital (Micro-SD), mini secure digital (Mini-SD), extreme digital (xD), a multimedia card (MMC), a memory stick, or the like. The external memory 1034 may be operatively and/or physically connected to the electronic device 1001 through various interfaces.

A security module 1036 may be a module that includes a storage space for which the security level is higher than that of the memory 1030 and may be a circuit that guarantees safe data storage in a protected execution environment. The security module 1036 may be implemented with a separate circuit and may include a separate processor. For example, the security module 1036 may be in a smart chip or a secure digital (SD) card, which is removable, or may include an embedded secure element (eSE) embedded in a fixed chip of the electronic device 1001. Furthermore, the security module 1036 may operate based on an operating system (OS) that is different from the OS of the electronic device 1001. For example, the security module 1036 may operate based on java card open platform (JCOP) OS.

The sensor module 1040 may measure, for example, a physical quantity or may detect an operation state of the electronic device 1001. The sensor module 1040 may convert the measured or detected information to an electric signal. For example, the sensor module 1040 may include at least one of a gesture sensor 1040A, a gyro sensor 1040B, a barometric pressure sensor 1040C, a magnetic sensor 1040D, an acceleration sensor 1040E, a grip sensor 1040F, the proximity sensor 1040G, a color sensor 1040H (e.g., red, green, blue (RGB) sensor), a biometric sensor 1040I, a temperature/humidity sensor 1040J, an illuminance sensor 1040K, or an UV sensor 1040M. Although not illustrated, the sensor module 1040 may further include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 1040 may further include a control circuit for controlling at least one or more sensors included therein. According to an embodiment, the electronic device 1001 may further include a processor that is a part of the processor 1010 or independent of the processor 1010 and is configured to control the sensor module 1040. The processor may control the sensor module 1040 while the processor 1010 remains at a sleep state.

The input device 1050 may be, for example, a touch panel 1052, a (digital) pen sensor 1054, a key 1056, or an ultrasonic input unit 1058. For example, the touch panel 1052 may use capacitive, resistive, infrared and/or ultrasonic detecting methods. Also, the touch panel 1052 may further include a control circuit. The touch panel 1052 may further include a tactile layer to provide tactile feedback to the user.

The (digital) pen sensor 1054 may be, for example, a part of a touch panel or may include an additional sheet for recognition. The key 1056 may include, for example, a physical button, an optical key, or a keypad. The ultrasonic input device 1058 may detect (or sense) an ultrasonic signal, which is generated from an input device, through a microphone (e.g., a microphone 1088) and may check data corresponding to the detected ultrasonic signal.

The display 1060 (e.g., the display 960) may be the panel 1062, the hologram device 1064, or the projector 1066. The panel 1062 may be the same as or similar to the display 960 illustrated in FIG. 9. The panel 1062 may be implemented, for example, to be flexible, transparent or wearable. The panel 1062 and the touch panel 1052 may be integrated into a single module. According to an embodiment, the panel 1062 may include a pressure sensor (or force sensor) that measures the intensity of touch pressure by a user. The pressure sensor may be implemented integrally with the touch panel 1052, or may be implemented as at least one sensor separately from the touch panel 1052. The hologram device 1064 may display a stereoscopic image into space using light interference. The projector 1066 may project light onto a screen so as to display an image. For example, the screen may be arranged to be within or outside the electronic device 1001. According to an embodiment, the display 1060 may further include a control circuit for controlling the panel 1062, the hologram device 1064, or the projector 1066.

The interface 1070 may be, for example, the high-definition multimedia interface (HDMI) 1072, the universal serial bus (USB) 1074, the optical interface 1076, or the D-subminiature (D-sub) 1078. The interface 1070 may be included, for example, in the communication interface 970 illustrated in FIG. 9. Additionally, the interface 1070 may further include, for example, a mobile high definition link (MHL) interface, a SD card/multi-media card (MMC) interface, or an infrared data association (IrDA) standard interface.

The audio module 1080 may converts sound to electric signals or vice versa. At least a part of the audio module 1080 may be included, for example, in the input/output interface 950 illustrated in FIG. 9. The audio module 1080 may process, for example, sound information that is input or output through the speaker 1082, the receiver 1084, the earphone 1086, or the microphone 1088.

For example, the camera module 1091 may shoot a still image or a video. According to an embodiment, the camera module 1091 may include image sensors (e.g., a front sensor or a rear sensor), lenses, one or more image signal processors (ISP), and/or a flash (e.g., an LED or a xenon lamp).

The power management module 1095 may manage, for example, the power of the electronic device 1001. According to an embodiment, a power management integrated circuit (PMIC), a charger IC, or a battery or fuel gauge may be included in the power management module 1095. The PMIC may employ wired or wireless charging methods. The wireless charging method may employ, for example, magnetic resonance charging, magnetic induction charging or electromagnetic charging. The PMIC may further include additional circuits such as coil loops, resonant circuits, rectifiers, or the like. The battery gauge may measure, for example, the remaining capacity of the battery 1096 and the voltage, current or temperature thereof while the battery is charged. The battery 1096 may be, for example, a rechargeable battery and/or a solar battery.

The indicator 1097 may display a specific state of the electronic device 1001 or a part thereof (e.g., the processor 1010), such as states when the electronic device 201 is booting state, transmitting/receiving a message, charging state, etc. The motor 1098 may convert an electrical signal into a mechanical vibration and may generate vibration, haptic feedback, etc. Although not illustrated, a processing device (e.g., a GPU) for supporting a mobile TV may be included in the electronic device 1001. The processing device for supporting the mobile TV may process media data according to the standards of digital multimedia broadcasting (DMB), digital video broadcasting (DVB), Media-FLO™, or the like.

Each of the above-mentioned elements of the electronic device according to various embodiments of the present disclosure may be configured with one or more components, and the names of the elements may be changed according to the type of the electronic device. In various embodiments, the electronic device may include at least one of the above-mentioned elements, and some elements may be omitted or other additional elements may be added. Furthermore, some of the elements of the electronic device according to various embodiments may be combined with each other so as to form one entity, so that the functions of the elements may be performed in the same manner as before the combination.

Figure 11:
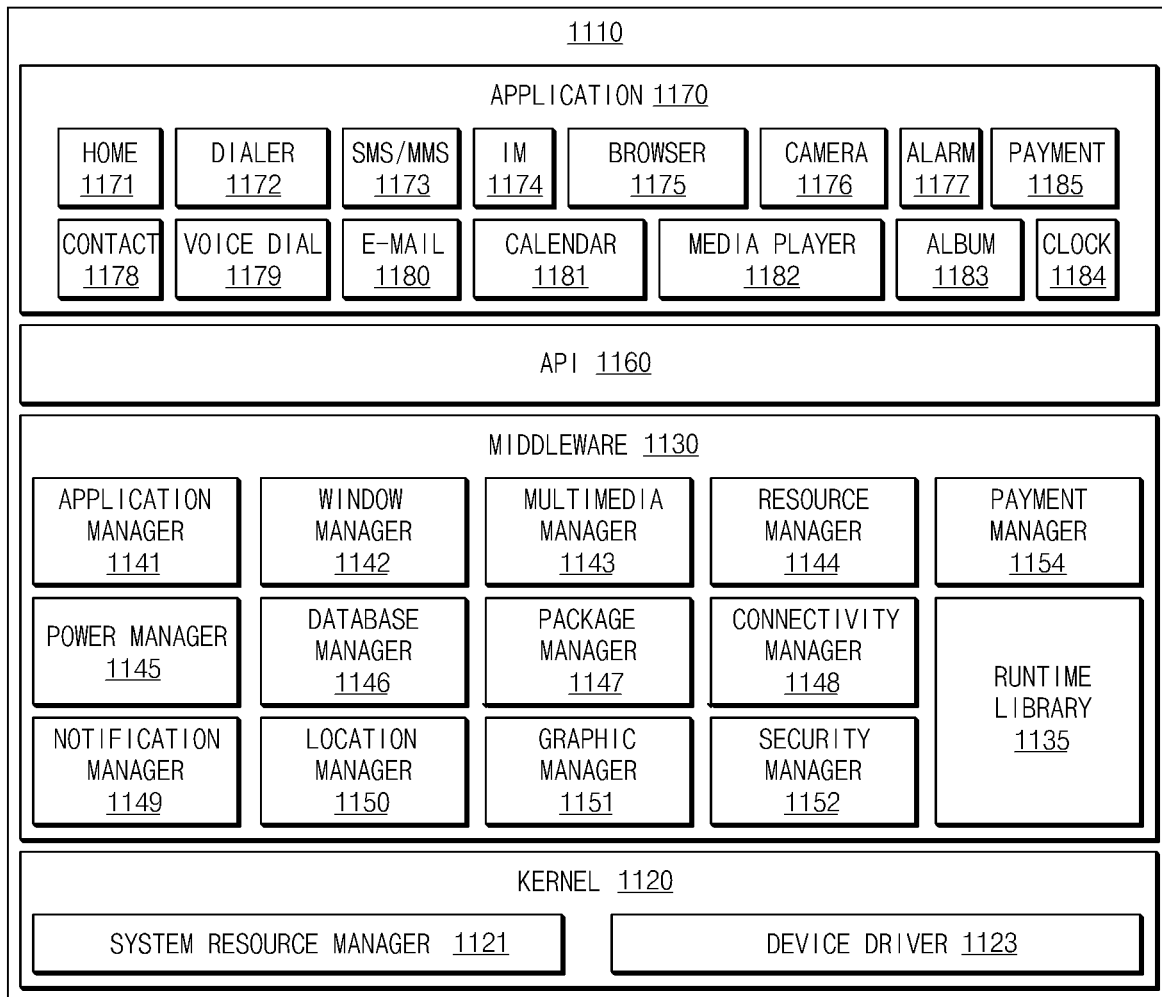
FIG. 11 illustrates a block diagram of a program module according to an embodiment.

FIG. 11 illustrates a block diagram of a program module according to an embodiment.

According to an embodiment, the program module 1110 (e.g., the program 940) may include an operating system (OS) to control resources associated with the corresponding electronic device (e.g., the electronic device 901), and/or applications (e.g., the application program 947) executing on top of the OS. The OS may be, for example, Android, iOS, Windows, Symbian, or Tizen.

The program module 1110 may include the kernel 1120, the middleware 1130, the application programming interface (API) 1160, and/or one or more applications 1170. At least a portion of the program module 1110 may be preloaded on the electronic device or may be downloadable from an external electronic device (e.g., the first electronic device 902, the second electronic device 904, the server 906, or the like).

The kernel 1120 (e.g., the kernel 941) may include, for example, the system resource manager 1121 or the device driver 1123. The system resource manager 1121 may control, allocate, or retrieve system resources. According to an embodiment, the system resource manager 1121 may include a process managing unit, a memory managing unit, a file system managing unit, or the like. The device driver 1123 may include, for example, a display driver, a camera driver, a Bluetooth driver, a shared memory driver, a USB driver, a keypad driver, a Wi-Fi driver, an audio driver, or an inter-process communication (IPC) driver.

The middleware 1130 may provide, for example, functions that the applications 1170 needs in common, or may provide various functions to the applications 1170 through the API 1160 to allow the applications 1170 to efficiently use the limited system resources of the electronic device. According to an embodiment, the middleware 1130 (e.g., the middleware 943) may include at least one of the runtime library 1135, the application manager 1141, the window manager 1142, the multimedia manager 1143, the resource manager 1144, the power manager 1145, the database manager 1146, the package manager 1147, the connectivity manager 1148, the notification manager 1149, the location manager 1150, the graphic manager 1151, the security manager 1152, or the payment manager 1154.

The runtime library 1135 may include, for example, a library module that is used by a compiler to generate new functions while the application 1170 is being executed. The runtime library 1135 may perform input/output management, memory management, or arithmetic functions.

The application manager 1141 may manage, for example, the life cycles of the applications 1170. The window manager 1142 may manage the graphic user interface (GUI) resource that is used in the display. The multimedia manager 1143 may identify formats necessary for playing back various media files, and may perform encoding or decoding of the media files by using codecs suitable for the formats. The resource manager 1144 may manage resources such as storage space, memory, or source code of the applications 1170.

The power manager 1145 may operate, for example, with the basic input/output system (BIOS) to manage power (e.g. battery power), and may provide power information for operations of the electronic device. The database manager 1146 may generate, search for, or modify database that is to be used in at least one application of the applications 1170. The package manager 1147 may install or update the application that is distributed in the package file.

The connectivity manager 1148 may manage, for example, wireless connections such as Wi-Fi or Bluetooth. The notification manager 1149 may display or notify an event such as a received message, appointment, or proximity notification. The location manager 1150 may manage location information about the electronic device. The graphic manager 1151 may manage graphic effects displayed on the display, or manage the user interface relevant thereto. The security manager 1152 may provide security functions necessary for system security, such as user authentication or the like. According to an embodiment, in the case where the electronic device (e.g., the electronic device 901) can perform telephony functions, the middleware 1130 may further include a telephony manager for managing voice or video calls.

The middleware 1130 may include a middleware module that combines various functions of the above-described elements. The middleware 1130 may provide modules specialized for each OS. Additionally, the middleware 1130 may dynamically remove a part of existing elements or may add new elements thereto.

The API 1160 (e.g., the API 945) may be, for example, a set of programming functions and may vary depending on the OS. For example, in the case where the OS is Android, it may provide one API set suitable for the Android OS. In the case where the OS is the tizen OS, it may provide two or more API sets.

The application(s) 1170 (e.g., the application program 947) may include, for example, one or more applications such as the home screen 1171, the dialer 1172, the SMS/MMS application 1173, the instant message (IM) application 1174, the browser 1175, the camera 1176, the alarm 1177, the contacts 1178, the voice dial 1179, the e-mail application 1180, the calendar 1181, the media player 1182, the album application 1183, the timepiece (clock application) 1184, the payment application 1185, health care applications (e.g., for measuring exercise quantity undertaken by the user, blood sugar, or the like) or environment information applications (e.g., for measuring barometric pressure, humidity, temperature, or the like).

According to an embodiment, the application 1170 may include an application (hereinafter referred to as "information exchanging application" for descriptive convenience) to support information exchange between the electronic device (e.g., the electronic device 901) and an external electronic device (e.g., the first electronic device 902 or the second electronic device 904). The information exchanging application may include, for example, a notification relay application for transmitting specific information to an external electronic device, or a device management application for managing the external electronic device.

For example, the notification relay application may perform the function of transmitting notification information, which arise from other applications (e.g., applications for SMS/MMS, e-mail, health care, or environmental information), to an external electronic device. Additionally, the notification relay application may receive, for example, notification information from an external electronic device and provide the notification information to the user.

The device management application may manage (e.g., install, delete, or update), for example, at least one function (e.g., turn-on/turn-off of a portion or all of the external electronic device, adjust the brightness or resolution of the display, etc.) of the external electronic device (e.g., the electronic device 902 or 904), an application running in the external electronic device, or a service (e.g., call service, message service, or the like) provided by the external electronic device.

According to an embodiment, the application 1170 may include an application (e.g., a health care application of a mobile medical device) that is assigned in accordance with an attribute of the external electronic device. According to an embodiment, the application 1170 may include an application that is received from an external electronic device (e.g., the first electronic device 902, the second electronic device 904, or the server 906). According to an embodiment, the application 1170 may include a preloaded application or a third party application that is downloadable from a server. The names of elements of the program module 1110 according to the embodiment may be modifiable depending on the types of the underlying operating system.

According to various embodiments, at least a portion of the program module 1110 may be implemented by software, firmware, hardware, or a combination of two or more thereof. At least a portion of the program module 1110 may be implemented (e.g., executed), for example, by the processor (e.g., the processor 1010). At least a portion of the program module 1110 may include, for example, modules, programs, routines, sets of instructions, processes, or the like for performing one or more functions.

The term "module" used in this disclosure may represent, for example, a unit including one or more combinations of hardware, software and firmware. The term "module" may be interchangeably used with the terms "unit," "logic,"

"logical block," "component" and "circuit." The "module" may be implemented mechanically or electronically. For example, the "module" may include at least one of an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in computer-readable storage media in the form of a program module. The instruction, when executed by a processor (e.g., the processor 920), may cause the one or more processors to perform a function corresponding to the instruction. The computer-readable storage media, for example, may be the memory 930.

A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and hardware devices (e.g., a read only memory (ROM), a random access memory (RAM), or a flash memory). Also, a program instruction may include not only a mechanical code such as things generated by a compiler but also a high-level language code executable on a computer using an interpreter. The above hardware unit may be configured to operate via one or more software modules for performing an operation of various embodiments of the present disclosure, and vice versa.

A module or a program module according to various embodiments may include at least one of the above elements, or a part of the above elements may be omitted, or additional other elements may be further included. Operations performed by a module, a program module, or other elements according to various embodiments may be executed sequentially, in parallel, repeatedly, or in a heuristic method. In addition, some operations may be executed in different sequences or may be omitted. Alternatively, other operations may be added.

According to embodiments of the present disclosure, it may be possible to reduce the volume and power consumption of an electronic device by disposing part of the force sensor of the electronic device directly in the display of the electronic device.

At least some aspects of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
    a housing including a first surface facing a first direction and a second surface facing a second direction opposite the first direction, wherein the housing includes a transparent member forming at least part of the first surface;
    a display interposed between the first surface and the second surface of the housing and exposed through the transparent member; and
    a force sensor interposed between the display and the second surface of the housing,
    wherein the force sensor includes:
        a first electrode layer disposed on a rear surface of the display, the first electrode layer substantially in parallel with the display;
        a second electrode layer consisting of a copper sheet laminated with a graphite sheet and is electrically connected with a ground of the display, the copper sheet being electrically ground and spaced apart from the first electrode layer in the second direction, the second electrode layer substantially in parallel with the first electrode layer; and
    an opaque adhesive member interposed between the first electrode layer and the second electrode layer.

2. The electronic device of claim 1, wherein the opaque adhesive member includes an opaque material and an adhesive material, and
    wherein the first electrode layer contacts a first surface of the opaque adhesive member in the first direction, and the second electrode layer contacts a second surface of the opaque adhesive member in the second direction.

3. The electronic device of claim 1, wherein the opaque adhesive member includes:
    a first adhesive layer in contact with the first electrode layer;
    a second adhesive layer spaced apart from the first adhesive layer in the second direction and in contact with the second electrode layer; and
    an opaque layer interposed between the first adhesive layer and the second adhesive layer.

4. The electronic device of claim 1, further comprising:
    a polymer interposed between the display and the first electrode layer to prevent oxidation of the opaque adhesive member.

5. The electronic device of claim 1, further comprising:
    a printed circuit board interposed between the second electrode layer and the second surface of the housing,
    wherein the second electrode layer includes a material that shields at least a part of electromagnetic interference (EMI) between the display and the printed circuit board.

6. An electronic device comprising:
    a display including a first surface facing a first direction and a second surface facing a second direction opposite the first direction;
    a transparent member disposed over the first surface of the display;
    a force sensor disposed on the second surface of the display; and
    a printed circuit board disposed below the force sensor in the second direction,
    wherein the force sensor includes:

a first electrode layer directly disposed on the second surface of the display;

an opaque adhesive member disposed on a surface of the first electrode layer facing the second direction; and a second electrode layer consisting of a copper sheet laminated with a graphite sheet and is electrically connected with a ground of the display, the copper sheet being electrically ground and disposed on a surface of the opaque adhesive member facing the second direction, wherein the first electrode layer, the second electrode layer, and the display are electrically connected to the printed circuit board.

7. The electronic device of claim 6, wherein the first electrode layer comprises a plurality of electrodes extending in a third direction parallel with the second surface of the display.

8. The electronic device of claim 7, wherein the second electrode layer comprises a plurality of electrodes extending in a fourth direction perpendicular to the third direction.

9. The electronic device of claim 6, wherein the second electrode layer is a bracket supporting the printed circuit board.

10. The electronic device of claim 6, further comprising:

a polarizer configured to convert light emitted from the display into polarized light; and a touch sensor configured to recognize a location of a touch input on or near the transparent member.

11. The electronic device of claim 10, wherein the touch sensor is interposed between the transparent member and the display, and wherein the polarizer is interposed between the transparent member and the touch sensor.

12. The electronic device of claim 10, wherein the polarizer is disposed on the first surface of the display; and wherein the touch sensor is embedded within the polarizer.

13. The electronic device of claim 10, wherein the touch sensor is interposed between the first surface and the second surface of the display; and wherein the polarizer is disposed on the first surface of the display.

14. The electronic device of claim 10, wherein the polarizer is disposed on the first surface of the display; and wherein the touch sensor is disposed over the polarizer in the first direction.

15. The electronic device of claim 10, wherein the touch sensor is disposed on a surface of the transparent member facing the second direction, and wherein the polarizer is disposed on the first surface of the display.

16. The electronic device of claim 6, further comprising:

a touch sensor configured to sense a location of a touch input from an object on or near the transparent member;

an integrated circuit connected to at least one of the display, the touch sensor, and the force sensor and configured to control driving timing of at least one of the display, the touch sensor, and the force sensor; and a processor configured to control the integrated circuit, wherein the processor is mounted on the printed circuit board.

17. The electronic device of claim 16, wherein the respective driving timing of the display, the touch sensor, and the force sensor are different from each other.

* * * * *